US012512057B2

(12) United States Patent
Kim et al.

(10) Patent No.: US 12,512,057 B2
(45) Date of Patent: Dec. 30, 2025

(54) PIXEL CIRCUIT AND DISPLAY DEVICE COMPRISING SAME

(71) Applicant: LG Display Co., Ltd., Seoul (KR)

(72) Inventors: Daekyu Kim, Paju-si (KR); Daesung Jung, Paju-si (KR); In Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/774,180

(22) Filed: Jul. 16, 2024

(65) Prior Publication Data

US 2025/0182686 A1   Jun. 5, 2025

(30) Foreign Application Priority Data

Nov. 30, 2023   (KR) ......................... 10-2023-0170642

(51) Int. Cl.
*G09G 3/3233*   (2016.01)
*H10K 59/122*   (2023.01)
(Continued)

(52) U.S. Cl.
CPC ... *G09G 3/3233* (2013.01); *G09G 2300/0426* (2013.01); *G09G 2300/0819* (2013.01);
(Continued)

(58) Field of Classification Search
CPC ......... G09G 3/3233; G09G 2300/0426; G09G 2300/0819; G09G 2300/0852;
(Continued)

(56) References Cited

U.S. PATENT DOCUMENTS 10,373,563 B2   8/2019   Park et al.
11,568,801 B2   1/2023   Park et al.
(Continued)

FOREIGN PATENT DOCUMENTS

KR   10-2012-0075030 A   7/2012
KR   10-2013-0049962 A   5/2013
(Continued)

OTHER PUBLICATIONS

Intellectual Property Office of the United Kingdom, Combined Search and Examination Report, United Kingdom Patent Application No. GB2411158.5, Dec. 5, 2024, seven pages.
(Continued)

*Primary Examiner* — Tom V Sheng
(74) *Attorney, Agent, or Firm* — Fenwick & West LLP

(57) ABSTRACT

A pixel circuit includes a light emitting element having an anode, a driving transistor having a first electrode connected to a high potential driving voltage line, a second electrode connected to the light emitting element, the driving transistor controlling a magnitude of driving current supplied to the light emitting element in response to a voltage applied to a gate electrode, a first switching transistor connected between a data line and the gate electrode of the driving transistor and receiving a first scan signal through a gate electrode, a light emitting transistor connected between the driving transistor and the light emitting element and receiving an emission signal through a gate electrode, and an initialization transistor connected between an initialization voltage line and the anode and receiving an inverted emission signal through a gate electrode, the inverted emission signal having a phase opposite to a phase of the emission signal.

21 Claims, 9 Drawing Sheets

(51) Int. Cl.
*H10K 59/40* (2023.01)
*H10K 59/80* (2023.01)

(52) U.S. Cl.
CPC .............. *G09G 2300/0852* (2013.01); *G09G 2300/0861* (2013.01); *G09G 2310/0286* (2013.01); *G09G 2310/08* (2013.01); *G09G 2320/0233* (2013.01); *G09G 2320/0247* (2013.01); *G09G 2340/0435* (2013.01); *H10K 59/122* (2023.02); *H10K 59/40* (2023.02); *H10K 59/873* (2023.02); *H10K 59/8792* (2023.02)

(58) Field of Classification Search
CPC ... G09G 2300/0861; G09G 2310/0286; G09G 2310/08; G09G 2320/0233; G09G 2320/0247; G09G 2340/0435; H10K 59/122; H10K 59/40; H10K 59/873; H10K 59/8792
USPC ......................................................... 345/212
See application file for complete search history.

(56) References Cited

U.S. PATENT DOCUMENTS

| | | | |
|---|---|---|---|
| 11,574,594 B2 | 2/2023 | Ka et al. | |
| 11,769,449 B2 | 9/2023 | Park et al. | |
| 11,798,467 B2 | 10/2023 | Kim et al. | |
| 11,817,056 B2 | 11/2023 | Kim et al. | |
| 11,996,051 B2 | 5/2024 | Ka et al. | |
| 12,033,570 B2 | 7/2024 | Kim et al. | |
| 12,094,415 B2 | 9/2024 | Kim et al. | |
| 2016/0240565 A1* | 8/2016 | Kim | H10D 86/481 |
| 2017/0092200 A1 | 3/2017 | Park et al. | |
| 2017/0329189 A1* | 11/2017 | Kim | G02F 1/13454 |
| 2021/0193049 A1* | 6/2021 | Lin | G09G 3/3291 |
| 2021/0217364 A1* | 7/2021 | Wang | G09G 3/3291 |
| 2021/0319755 A1* | 10/2021 | Kim | G09G 3/3233 |
| 2022/0044634 A1 | 2/2022 | Ka et al. | |
| 2022/0277709 A1* | 9/2022 | Lee | G09G 3/20 |
| 2022/0366835 A1 | 11/2022 | Park et al. | |
| 2023/0115779 A1* | 4/2023 | Kim | G09G 3/32 345/55 |
| 2023/0178006 A1 | 6/2023 | Park et al. | |
| 2023/0186856 A1 | 6/2023 | Ka et al. | |
| 2023/0215360 A1* | 7/2023 | Kim | G09G 3/3266 |
| 2023/0215364 A1* | 7/2023 | Lim | G09G 3/3266 345/691 |
| 2023/0335045 A1* | 10/2023 | Hu | G09G 3/32 |
| 2023/0360591 A1 | 11/2023 | Kim et al. | |
| 2024/0013711 A1 | 1/2024 | Park et al. | |
| 2024/0038169 A1 | 2/2024 | Kim et al. | |
| 2024/0185802 A1* | 6/2024 | Han | G09G 3/3275 |
| 2024/0221651 A1* | 7/2024 | Park | G09G 3/3233 |
| 2024/0257739 A1* | 8/2024 | Noh | G09G 3/3233 |
| 2024/0312418 A1 | 9/2024 | Ka et al. | |
| 2025/0006129 A1 | 1/2025 | Kim et al. | |
| 2025/0126996 A1* | 4/2025 | Byun | G09G 3/3233 |

FOREIGN PATENT DOCUMENTS

| | | |
|---|---|---|
| KR | 10-2017-0039052 A | 4/2017 |
| KR | 10-2017-0081078 A | 7/2017 |
| KR | 10-2019-0023288 A | 3/2019 |
| KR | 10-2020-0046796 A | 5/2020 |
| KR | 10-2022-0018119 A | 2/2022 |
| KR | 10-2022-0155537 A | 11/2022 |
| KR | 10-2023-0050024 A | 4/2023 |
| KR | 10-2023-0104317 A | 7/2023 |

OTHER PUBLICATIONS

Korean Intellectual Property Office, Office Action, Korean Patent Application No. 10-2023-0170642, Nov. 30, 2024, eight pages, (with concise explanation of relevance).

* cited by examiner

PIXEL CIRCUIT AND DISPLAY DEVICE COMPRISING SAME

CROSS-REFERENCE TO RELATED APPLICATION

This application claims priority from Republic of Korea Patent Application No. 10-2023-0170642, filed on Nov. 30, 2023, which is incorporated by reference in its entirety.

BACKGROUND

Field

The present disclosure relates to a pixel and a display device including the same.

Description of Related Art

As the information society develops, various demands for display devices for displaying images are increasing, and various types of display devices such as liquid crystal display (LCD) devices and organic light emitting diode (OLED) display devices are utilized.

Images displayed on a display device may be still images or moving images, and the moving image may include various types such as sports images, game images, and movies. The display device is driven in a variable refresh rate (VRR) mode in which a driving frequency varies depending on the type of an image, thereby reducing power consumption and extending the lifetime of the display device.

When the variable refresh rate mode is applied to drive pixels at various refresh rates, a brightness difference occurs between the pixels due to different refresh rates, thereby causing quality degradation, such as image warpage or flicker.

SUMMARY

Embodiments of the present disclosure are directed to providing a pixel that includes a transistor formed to have a gate electrode receiving an inverted emission signal, thereby minimizing or at least reducing charging/discharging of a light emitting element, and a display device including the same.

The embodiments of the present disclosure are also directed to providing a pixel that reduces on-bias stress of a driving transistor by forming a capacitor between an inverted emission signal line and a node of the pixel, and a display device including the same.

The embodiments of the present disclosure are also directed to providing a pixel capable of adjusting charging/discharging delay times by separating a reference voltage and an initialization voltage.

A pixel circuit according to one or more embodiments of the present disclosure may include a light emitting element having an anode, a driving transistor having a first electrode connected to a high potential driving voltage line, a second electrode connected to the light emitting element, and a gate electrode, the driving transistor configured to control a magnitude of driving current supplied to the light emitting element in response to a voltage applied to the gate electrode of the driving transistor, a first switching transistor having a gate electrode, the first switching transistor connected between a data line and the gate electrode of the driving transistor, the first switching transistor configured to receive a first scan signal through the gate electrode of the first switching transistor, a light emitting transistor having a gate electrode, the light emitting transistor connected between the driving transistor and the light emitting element, the light emitting transistor configured to receive an emission signal through the gate electrode of the light emitting transistor, and an initialization transistor having a gate electrode, the initialization transistor connected between an initialization voltage line and the anode of the light emitting element, the initialization transistor configured to receive an inverted emission signal through the gate electrode of the initialization transistor, the inverted emission signal having a phase opposite to a phase of the emission signal.

In a variable refresh rate mode, the pixel circuit may be driven at a low frequency in which one frame includes an anode initialization period and an emission period, during the anode initialization period, the emission signal may be applied at a turn-off level, and during the emission period, the emission signal is applied at a turn-on level, and the initialization transistor may apply the initialization voltage to the anode of the light emitting element in response to the inverted emission signal during the anode initialization period.

The pixel circuit may further include a coupling capacitor connected between an inverted emission signal line to which the inverted emission signal is applied and the gate electrode of the driving transistor.

The coupling capacitor may transmit a coupling voltage corresponding to the inverted emission signal to the gate electrode of the driving transistor during the anode initialization period.

The pixel circuit may further include a storage capacitor connected to the first switching transistor through a first node and connected to the gate electrode of the driving transistor through a second node.

The pixel circuit may further include a coupling capacitor connected between an inverted emission signal line to which the inverted emission signal is applied and the first node.

The pixel circuit may further include a second switching transistor connected between the gate electrode of the driving transistor and the second electrode of the driving transistor and receiving a second scan signal through a gate electrode, a third switching transistor connected between a reference voltage line and the first node and receiving the emission signal through a gate electrode, and a fourth switching transistor connected between the initialization voltage line and the anode of the light emitting element and receiving the second scan signal through a gate electrode.

The second switching transistor may be formed of a plurality of sub-transistors connected in series and receiving the second scan signal through gate electrodes.

A display device according to one or more embodiments of the present disclosure may include a display panel including a display area with a plurality of pixel circuits in the display area, and a non-display area adjacent to the display area, at least one gate driver configured to apply a first scan signal, an emission signal, and an inversed emission signal to the plurality of pixel circuits, the inversed emission signal having a phase opposite to a phase of the emission signal, a data driver configured to apply a data voltage to the plurality of pixel circuits, a power supply unit configured to apply a voltage for driving the plurality of pixel circuits, and a timing controller configured to control driving timing of the display panel.

A pixel circuit of the plurality of pixel circuits may include a light emitting element having an anode, a driving transistor having a first electrode connected to a high potential driving voltage line, a second electrode connected to the light emitting element, and a gate electrode, the driving transistor configured to control a magnitude of driving current supplied to the light emitting element in response to a voltage applied to the gate electrode of the driving transistor, a first switching transistor configured to transmit the data voltage to the gate electrode of the driving transistor in response to the first scan signal, a light emitting transistor configured to form a current path between the driving transistor and the light emitting element in response to the emission signal, and an initialization transistor configured to transmit an initialization voltage to the anode of the light emitting element in response to the inverted emission signal.

The at least one gate driver may include gate drivers disposed at each of left and right sides of the display area in the non-display area and configured symmetrically.

Each of the gate drivers may include a first shift register configured to output the first scan signal, a second shift register configured to output the second scan signal, a third shift register configured to output the emission signal, and a fourth shift register configured to output the inverted emission signal.

The fourth shift register may be disposed closer to the display area than the third shift register is and configured to receive the emission signal output from the third shift register to the pixel circuits, and invert a phase of the received emission signal.

The timing controller may drive the pixel circuit at a low frequency in which one frame includes an anode initialization period and an emission period in a variable refresh rate mode, the gate driver may apply an emission signal at a turn-off level to the pixel circuits during the anode initialization period and applies the emission signal at a turn-on level to the pixel circuits during the emission period, and the initialization transistor may apply the initialization voltage to the anode of the light emitting element in response to the inverted emission signal during the anode initialization period.

The pixel circuit may further include a coupling capacitor connected between an inverted emission signal line to which the inverted emission signal is applied and the gate electrode of the driving transistor.

The coupling capacitor may transmit a coupling voltage corresponding to the inverted emission signal to the gate electrode of the driving transistor during the anode initialization period.

The pixel circuit may further include a storage capacitor connected to the first switching transistor through a first node and connected to the gate electrode of the driving transistor through a second node.

The pixel circuit may further include a coupling capacitor connected between an inverted emission signal line to which the inverted emission signal is applied and the first node.

The pixel circuit may further include a second switching transistor connected between the gate electrode of the driving transistor and the second electrode of the driving transistor and receiving a second scan signal through a gate electrode, a third switching transistor connected between a reference voltage line and the first node and receiving the emission signal through a gate electrode, and a fourth switching transistor connected between the initialization voltage line and the anode of the light emitting element and receiving the second scan signal through a gate electrode.

The second switching transistor may be formed of a plurality of sub-transistors connected in series and receiving the second scan signal through gate electrodes.

DETAILED DESCRIPTION

Figure 1:
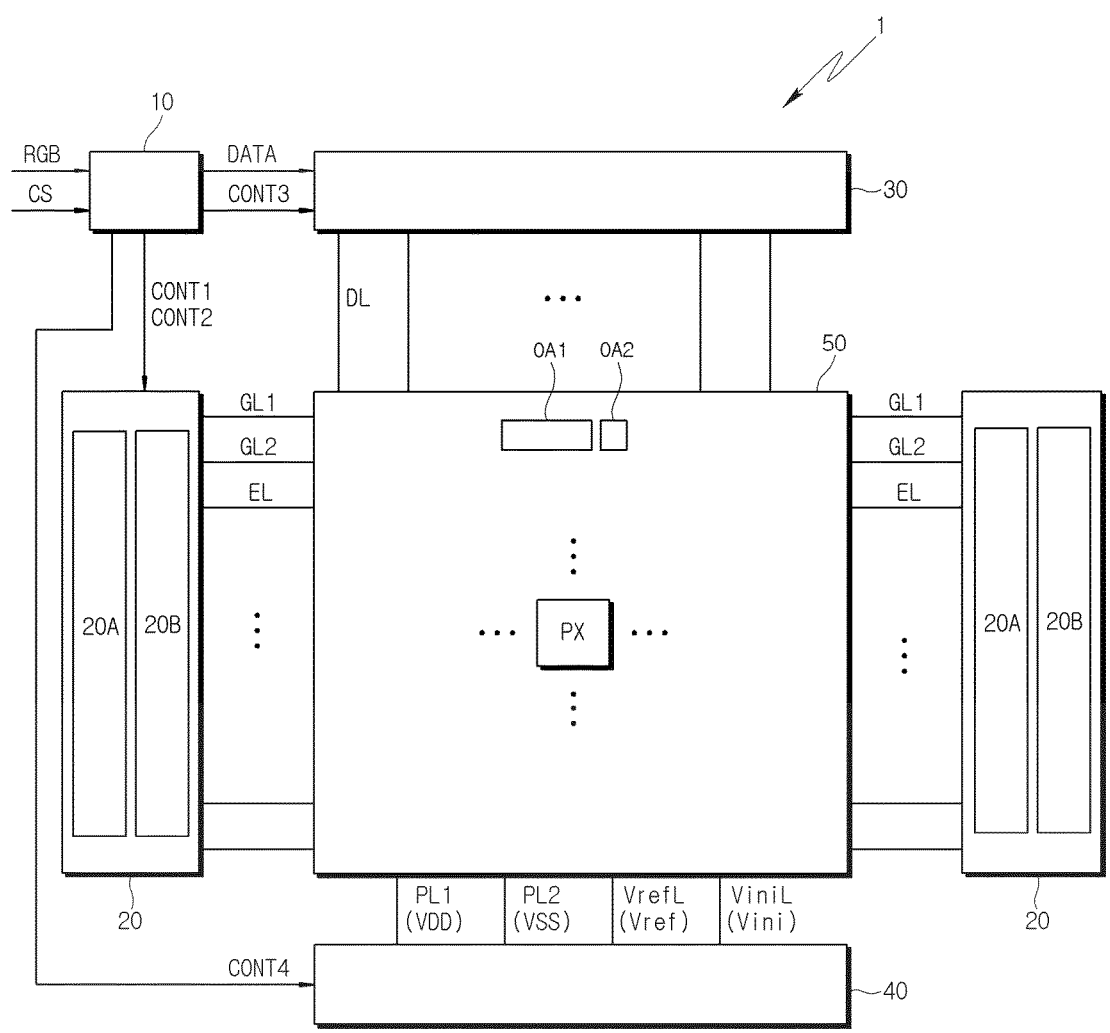
FIG. 1 is a block diagram showing a configuration of a display device according to one or more embodiments of the present disclosure.

Hereinafter, embodiments of the present disclosure will be described with reference to the accompanying drawings. In the present disclosure, when a first component (or an area, a layer, a portion, or the like) is described as "on," "connected," or "coupled to" a second component, it means that the first component may be directly connected/coupled to the second component or a third component may be disposed therebetween.

The same reference numerals indicate the same components. In addition, in the drawings, thicknesses, proportions, and dimensions of components are exaggerated for effective description of technical contents. The term "and/or" includes all one or more combinations that may be defined by the associated configurations.

Terms such as first and second may be used to describe various components, but the components are not limited by the terms. The terms are used only for the purpose of distinguishing one component from another. For example, a first component may be referred to as a second component, and similarly, the second component may also be referred to as the first component without departing from the scopes of the embodiments. The singular expression includes the plural expression unless the context clearly dictates otherwise.

Terms such as "under," "at a lower side," "above," and "at an upper side" are used to describe the relationship between the components illustrated in the drawings. The terms are relative concepts and are described with respect to directions marked in the drawings.

It should be understood that term such as "includes", "comprises" or "has" is intended to specify the presence of features, numbers, steps, operations, components, parts, or a combination thereof described in the present disclosure and does not preclude the presence or addition possibility of one or more other features, numbers, steps, operations, components, parts, or combinations thereof in advance.

FIG. 1 is a block diagram showing a display device according to one or more embodiments of the present disclosure.

Referring to FIG. 1, a display device 1 includes a timing controller 10, a gate driver 20, a data driver 30, a power supply unit 40, and a display panel 50.

The timing controller 10 may receive image signals RGB and a control signal CS from an external host system 2 or the like. The image signals RGB may include a plurality of grayscale data. The control signal CS may include, for example, a horizontal synchronization signal, a vertical synchronization signal, and a main clock signal.

The timing controller 10 may process the image signals RGB and the control signal CS according to operating conditions of the display panel 60, and generate and output image data DATA, a gate driving control signal CONT1, an emission driving control signal CONT2, a data driving control signal CONT3, and a power supply control signal CONT4.

The gate driver 20 may include a scan driver 20A for generating scan signals based on the gate driving control signal CONT1 output from the timing controller 10. The scan driver 20A may provide the generated scan signals to pixel circuits PX through a plurality of gate lines GL1. In one or more embodiments, one pixel circuit PX may be configured to receive a plurality of scan signals with different waveforms. In the one or more embodiments, the scan driver 20A may provide the plurality of scan signals to the pixel circuits PX through the corresponding gate lines GL1 and GL2.

The gate driver 20 may further include an emission driver 20B for generating emission control signals based on the emission driving control signal CONT2 output from the timing controller 10. The emission driver 20B may provide the generated emission control signals to the pixel circuits PX through emission lines EL.

The gate driver 20 may be configured in a form of a gate in panel mounted on the display panel 50. The gate driver 20 may be disposed at one side of the display panel 50 or both sides (e.g., left and right sides) of the display panel 50 as shown in FIG. 1. According to a driving method, a panel design method, and the like, the gate driver 20 may be disposed at both sides (e.g., left and right sides) of the display panel 50 as shown or connected to two or more of four side surfaces of the display panel 50.

The data driver 30 may generate data signals based on the image data DATA and the data driving control signal CONT3 that are output from the timing controller 10. The data driver 30 may provide the generated data signals to the pixel circuits PX through a plurality of data lines DL.

The power supply unit 40 (e.g., a power supply circuit) may generate a high potential driving voltage VDD and a low potential driving voltage VSS to be provided to the display panel 50 based on the power supply control signal CONT4. The power supply unit 40 may provide the generated driving voltages VDD and VSS to the pixel circuits PX through the corresponding voltage lines PL1 and PL2. In addition, the power supply unit 40 may further generate a reference voltage Vref and/or an initialization voltage Vini that are required for driving the pixel circuits PX and provide the reference voltage Vref and/or an initialization voltage Vini to the pixel circuits PX through the corresponding voltage lines VrefL and ViniL.

A plurality of pixel circuits PX (or referred to as "sub-pixel circuits") are disposed on the display panel 50. For example, the pixel circuits PX may be arranged in a form of a matrix on the display panel 50. Pixel circuits PX disposed in one pixel row are connected to the same gate lines GL1 and GL2 and emission line EL, and pixel circuits PX disposed in one pixel column are connected to the same data line DL. The pixel circuits PX may emit light with brightness corresponding to the gate signal and the data signal that are supplied through the gate lines GL1 and GL2 and the data lines DL in response to the emission control signal applied through the emission line EL.

In one or more embodiments, each pixel circuit PX may display any one of red, green, and blue. In one or more other embodiments, each pixel circuit PX may display any one of cyan, magenta, and yellow. In various embodiments, each pixel circuit PX may display any one of red, green, blue, and white.

In one or more embodiments, one or more optical areas OA1 and OA2 may be disposed in the display panel 50. The one or more optical areas OA1 and OA2 may be disposed to overlap one or more optical electronic devices, such as a photographing device, such as a camera (image sensor), or a detection sensor, such as a proximity sensor and an illuminance sensor.

For an operation of the optical electronic device, the one or more optical areas OA1 and OA2 may include a light transmission structure and have a transmittance at a predetermined level or higher. The light transmission structure may be formed by patterning a cathode in a portion in which the pixel circuit PX is not disposed. The cathode may be removed using a laser or patterned by selectively forming the cathode through a cathode anti-deposition layer.

Alternatively, the light transmission structure may be formed by separating the light emitting element from the pixel circuit PX. In the one or more embodiments, the light emitting element of the pixel circuit PX may be positioned on the optical areas OA1 and OA2, a plurality of transistors constituting the pixel circuit PX may be disposed near the optical areas OA1 and OA2, and the light emitting element and the pixel may be electrically connected through a transparent metal layer.

The number of pixel circuits PX per unit area in the one or more optical areas OA1 and OA2 may be smaller than the number of pixel circuits PX per unit area in the remaining areas excluding the optical areas OA1 and OA2. In other words, the resolution of the one or more optical areas OA1 and OA2 may be lower than the resolution of the remaining areas. The timing controller 10, the gate driver 20, the data driver 30, and the power supply unit 40 may each be configured as a separate integrated circuit (IC) or an IC in which at least some thereof are integrated.

In one or more embodiments, the display device 1 may be driven in a variable refresh rate mode in which a driving frequency may be changed. For example, the display device 1 may be driven at a refresh rate that is higher or lower than a predetermined reference refresh rate. When the display device 1 is driven at a rate lower than the reference refresh rate, it can be referred to as "low-frequency driving," and when the display device 1 is driven at a rate higher than the reference refresh rate, it can be referred to as "high-frequency driving." The refresh rate may be determined according to the type of image to be displayed or the like, but is not limited thereto.

The timing controller 10 may generate the control signals CONT1 to CONT4 so that the pixel circuit PX may be driven at various refresh rates. For example, the timing controller 10 may change the refresh rate by changing a frequency of the clock signal included in the control signals CONT1 to CONT4, adjusting the timing of the horizontal synchronization signal or the vertical synchronization signal, or driving the gate driver 20 in a mask manner.

Figure 2:
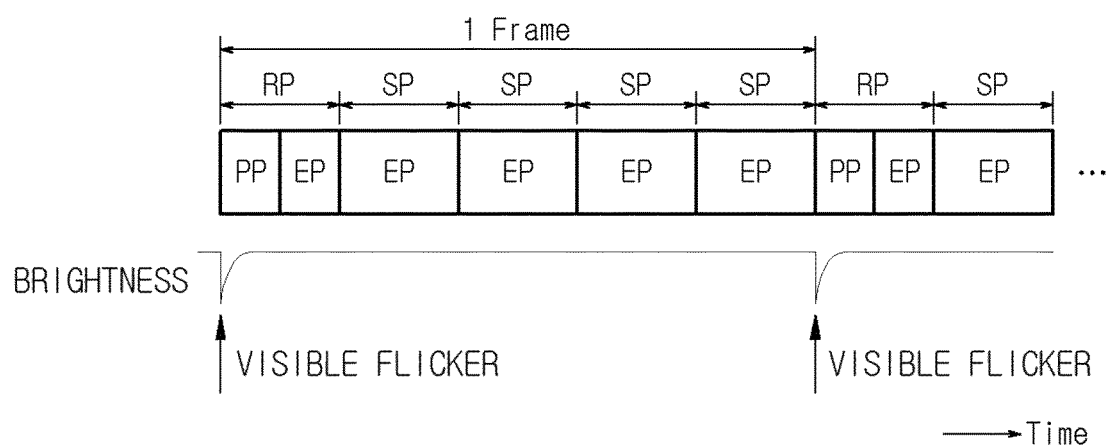
FIG. 2 is a view showing a method of driving the display device according to one embodiment of the present disclosure.

FIG. 2 is a view showing a method of driving the display device according to one embodiment of the present disclosure.

In the variable refresh rate mode, one frame may be configured in a combination of at least one refresh period RP and at least one skip period SP. During the refresh period RP, each pixel circuit PX (see FIG. 1) may be programmed with a new data voltage, and the light emitting element of the pixel circuit PX may emit light in response to the programmed data voltage. The refresh period RP may be subdivided into an initialization period, a sampling period, a hold period, and the like for data voltage programming. The refresh period RP may also be referred to as "refresh frame."

A process of applying a new data voltage to the pixel circuit PX during the skip period SP is omitted. During the skip period SP, the light emitting element of each pixel circuit PX may emit light in response to the data voltage programmed in the previous refresh period RP. The skip period SP may be referred to as "hold period," "skip frame," "hold frame," or the like.

In one or more embodiments, to change the refresh rate, a length of one frame may be changed by adjusting the number or lengths of skip periods SP. Then, the length of the refresh period RP may be sufficiently secured to allow the data voltage to be stably programmed.

In the one or more embodiments, a generation cycle of the refresh period RP may be changed depending on the variable refresh rate. The generation cycle of the refresh period RP increases as the refresh rate decreases, and the number of skip periods SP between the refresh periods RP increases as the refresh rate decreases.

For example, the generation cycle of the refresh period RP may be 120/1 second at 120 Hz, 60/1 second at 60 Hz, 24/1 second at 24 Hz, and ¹/₁ second at 1 Hz. The number of skip periods SP positioned between two neighboring refresh periods RP may be 0 at 120 Hz, 1 at 60 Hz, 4 at 24 Hz, and 9 at 1 Hz, and in FIG. 2, an example of 24 Hz is shown. However, the present embodiment is not limited thereto.

The refresh period RP includes a programming period PP and an emission period EP. During the programming period PP, a new data voltage is programmed into the pixel circuits PX, and during the emission period EP, the pixel circuit PX emits light in response to the programmed data voltage.

The skip period SP includes only the emission period EP in which the emission signal EM (see FIG. 1) has a turn-on level. During the emission period EP, the pixel circuits PX maintain the luminous brightness of the previous refresh period RP.

In one or more embodiments, a length of the emission period EP of the skip period SP may be larger than a length of the emission period EP of the refresh period RP. Therefore, comparing the brightness integral amount for a constant time, the lower the refresh rate (i.e., the larger the number of skip periods SP), the relatively larger the brightness integral amount. For example, the brightness integral amount for the constant time is larger at 60 Hz than at 120 Hz, larger at 24 Hz than at 60 Hz, and larger at 1 Hz than at 24 Hz.

Due to a difference in brightness integral amount according to the refresh rate, flicker may be visible when the refresh rate is changed.

Figure 3:
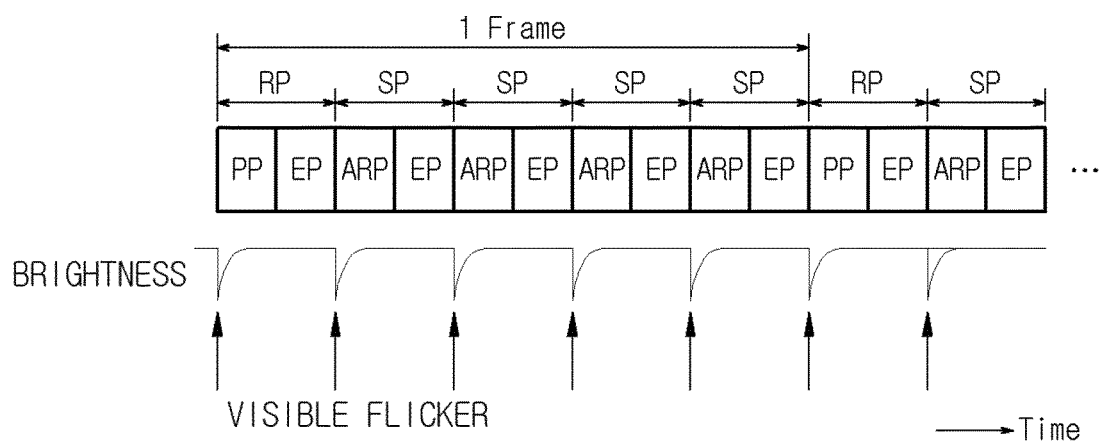
FIG. 3 is a view showing a method of driving the display device according to another embodiment of the present disclosure.

FIG. 3 is a view showing a method of driving a display device according to another embodiment of the present disclosure.

In one or more embodiments, during the skip period SP, an anode of the light emitting element included in the pixel circuit PX (see FIG. 1) may be reset to a predetermined reset voltage (e.g., an initialization voltage). In the one or more embodiments, the skip period SP may be referred to as "anode initialization period" or "anode initialization frame."

The refresh period RP includes a programming period PP and an emission period EP. During the programming period PP, a new data voltage is programmed into the pixel circuits PX, and during the emission period EP, the pixel circuit PX emits light in response to the programmed data voltage.

The skip period SP includes an anode initialization period ARP in which the emission signal EM (see FIG. 1) has a turn-off level and an emission period EP in which the emission signal EM has a turn-on level. During the anode initialization period ARP, a predetermined reset voltage (e.g., an initialization voltage) is applied to the anode of the light emitting element included in the pixel circuits PX. During the period, the light emitting element may not emit light due to the reset voltage. During the emission period EP, the pixel circuits PX emit light with the luminous brightness of the immediately preceding refresh period RP.

A length of the anode initialization period ARP may be equal to a length of the programming period PP so that the brightness integral amounts of the skip period SP and the refresh period RP are equal to each other. As described above, in the embodiment including the anode initialization period ARP, deviation of the brightness integral amounts according to the refresh rate does not occur, and flicker due to the difference in brightness integral amounts can be suppressed.

Figure 4:
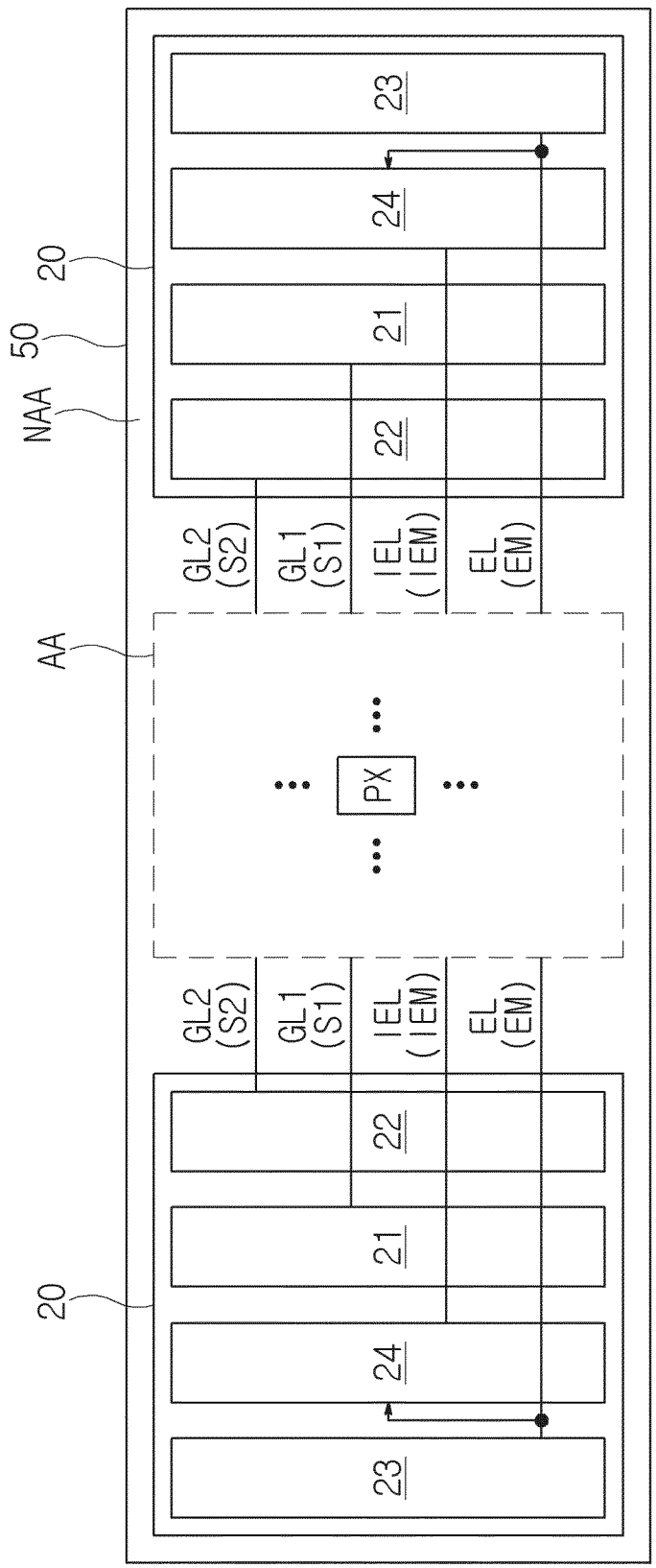
FIG. 4 is a block diagram showing a configuration of a gate driver according to one or more embodiments of the present disclosure.

FIG. 4 is a block diagram showing a configuration of a gate driver according to one or more embodiments of the present disclosure.

Referring to FIG. 4, the display panel 50 may include a display area AA in which images are displayed and a non-display area NAA in which images near the display area AA are not displayed.

An array of pixel circuits PX is disposed in the display area AA. At least some of the drivers may be mounted on or connected to the non-display area NAA. For example, the gate driver 20 may be disposed at one side or both sides (e.g., left and right sides) as shown of the display area AA in the non-display area NAA. The gate drivers 20 disposed at both sides of the display area AA may be configured symmetrically (in a form of mirroring). Hereinafter, a configuration will be described based on the gate driver 20 disposed at the left side of the display area AA.

The gate driver 20 may include first to fourth shift registers 21, 22, 23, and 24.

The first and second shift registers 21 and 22 are configured to output scan signals. For example, the first shift register 21 may sequentially output a first scan signal S1 through the first gate lines GL1, and the second shift register 22 may sequentially output a second scan signal S2 through the second gate lines GL2.

Each of the first and second shift registers 21 and 22 may be composed of dependently connected stage circuits. Each stage circuit may be connected to the corresponding gate lines GL1 and GL2 to output the scan signals S1 and S2 to the gate lines GL1 and GL2.

The first and second scan signals S1 and S2 may be used to drive at least one transistor provided in the pixel circuit PX. For example, the first and second scan signals S1 and S2 may be used to program image data DATA (see FIG. 1) into the pixel circuit PX, initialize the voltage stored in the pixel circuit PX, or compensate the characteristics of the circuit element.

The third and fourth shift registers 23 and 24 are configured to output an emission signal and an inverted emission signal. For example, the third shift register 23 may output the emission signal EM through the emission lines EL, and the fourth shift register 24 may output the inverted emission signal having a reversed phase with respect to the emission signal EM through an inverted emission line IEL. In the one or more embodiments, the fourth shift register 24 may be configured to receive the emission signal EM output from the third shift register 23 and generate and output an inverted signal of the emission signal EM by at least one circuit element for inverting a phase of the input emission signal EM.

The emission signal EM and the inverted emission signal IEM may be used to drive at least one transistor provided in the pixel circuit PX. For example, the emission signal EM may be used to change or control an emission time of the pixel circuit PX.

In the embodiment shown in FIG. 4, the first and second shift registers 21 and 22 may be disposed adjacent to the display area AA, and the third and fourth shift registers 23 and 24 may be disposed relatively away from the display area AA. In addition, the fourth shift register 24 that outputs the inverted emission signal IEM may be disposed relatively adjacent to the display area AA compared to the third shift register 23 to receive the emission signal EM output from the third shift register 23 to the pixel circuits PX.

However, the arrangement of the shift registers 21, 22, 23, and 24 is not limited to that shown in FIG. 4. The arrangement of the shift registers 21, 22, 23, and 24 may be changed variously in the possible range to decrease the size of the non-display area NAA and decrease lengths and amounts of lines according to the specifications of the display panel 50.

Figure 5:
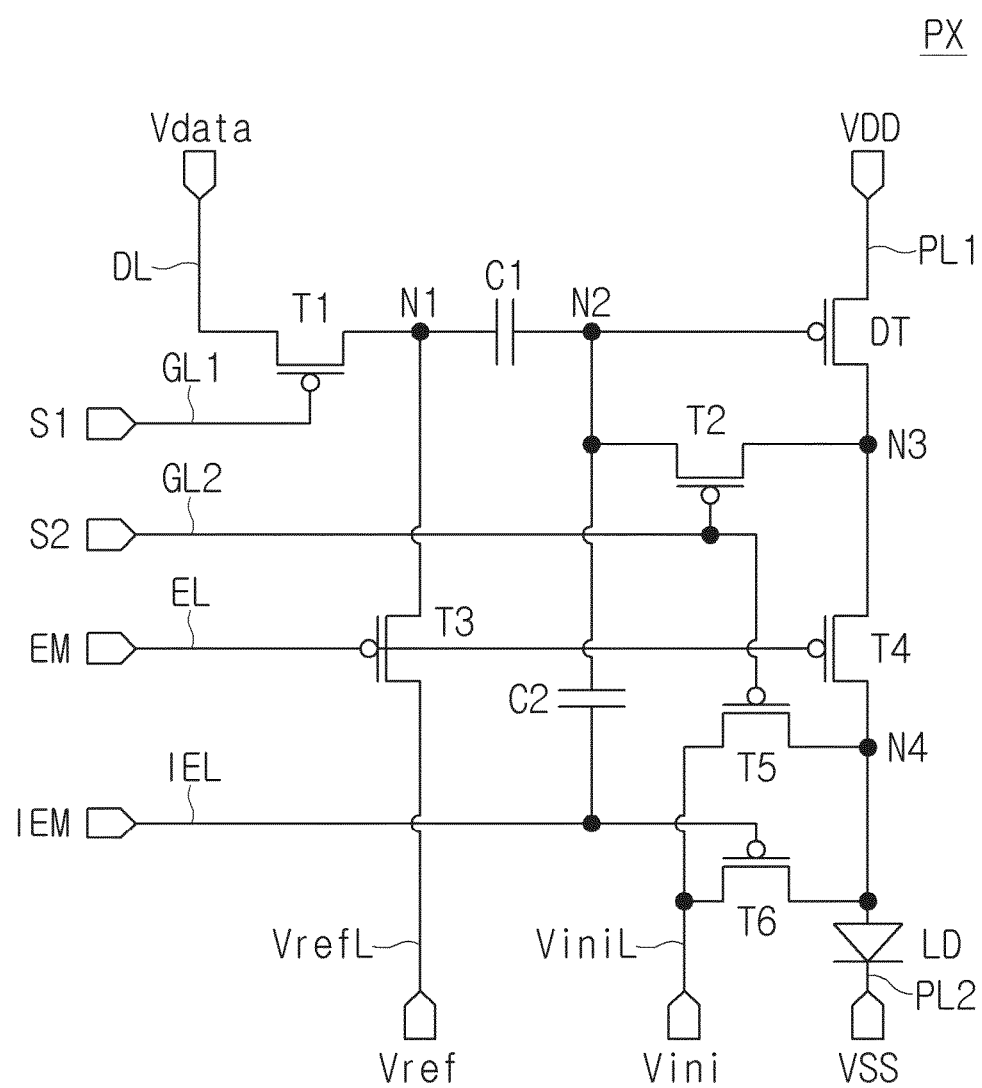
FIG. 5 is a circuit diagram of a pixel according to a first embodiment of the present disclosure.

FIG. 5 is a circuit diagram of a pixel according to a first embodiment of the present disclosure. In FIG. 5, for convenience of description, a pixel connected to a $n^{th}$ pixel row (n is an integer larger than 0) is shown as an example.

Referring to FIG. 5, the pixel circuit PX according to one or more embodiments may include a driving transistor DT, a light emitting element LD connected to the driving transistor DT, and a control circuit for controlling the magnitude of driving current to be applied to the light emitting element LD through the driving transistor DT. For example, the control circuit may include first to sixth transistors T1 to T6 and first and second capacitors C1 and C2.

A first electrode of the driving transistor DT is formed to receive the high potential driving voltage VDD (connected to the high potential driving voltage line PL1), and a second electrode thereof is connected to a third node N3. A gate electrode of the driving transistor DT is connected to a second node N2. The driving transistor DT may be turned on according to a voltage applied to the second node N2 to control the magnitude of driving current flowing to the light emitting element LD.

A first electrode of the first transistor T1 is connected to the data line DL, and a second electrode thereof is connected to a first node N1. A gate electrode of the first transistor T1 may be connected to the first gate line GL1 to receive the first scan signal S1. The first transistor T1 may be turned on according to the first scan signal S1 applied to the first gate line GL1 to transmit a data voltage Vdata applied to the data line DL to the first node N1. The first transistor T1 may be referred to as "first switching transistor."

The first capacitor C1 is connected between the first node N1 and the second node N2. The first capacitor C1 may store a voltage corresponding to a voltage difference between the first node N1 and the second node N2. For example, the first capacitor C1 may store a voltage corresponding to a difference between the data voltage Vdata applied to the data line DL and a voltage at the second node N2 and maintain the stored voltage for one frame period, thereby stabilizing the voltage of the gate electrode (i.e., the second node N2) of the driving transistor DT. The first transistor C1 may be referred to as "storage capacitor."

The second transistor T2 is connected between the second node N2 and the third node N3. A gate electrode of the second transistor T2 may be connected to the second gate line GL2 to receive the second scan signal S2. The second transistor T2 may be turned on according to the second scan signal S2 applied to the second gate line GL2 to electrically connect the gate electrode (second node N2) of the driving transistor DT with the second electrode T2 (third node N3). The second transistor T2 may be referred to as "second switching transistor."

A first electrode of the third transistor T3 is formed to receive the reference voltage Vref (connected to a reference voltage line Vref1), and a second electrode thereof is connected to the first node N1. A gate electrode of the third transistor T3 may be connected to the emission line EL to receive the emission signal EM. The third transistor T3 may be turned on according to the emission signal EM applied to the emission line EL to transmit the reference voltage Vref to the first node N1. The third transistor T3 may be referred to as "third switching transistor."

The fourth transistor T4 is connected between the third node N3 and a fourth node N4. A gate electrode of the fourth transistor T4 may be connected to the emission line EL to receive the emission signal EM. The fourth transistor T4 may be turned on according to the emission signal EM applied to the emission line EL to electrically connect the driving transistor DT (third node N3) with the light emitting element LD (fourth node N4). The fourth transistor T4 may be referred to as "light emitting transistor."

A first electrode of the fifth transistor T5 is formed to receive the initialization voltage Vini (connected to an initialization voltage line ViniL), and a second electrode thereof is connected to the fourth node N4. A gate electrode of the fifth transistor T5 may be connected to the second gate line GL2 to receive the second scan signal S2. The fifth transistor T5 may be turned on according to the second scan signal S2 applied to the second gate line GL2 to apply the initialization voltage Vini to the anode (fourth node N4) of the light emitting element LD. The fifth transistor may be referred to as "fourth switching transistor."

A first electrode of the sixth transistor T6 is formed to receive the initialization voltage Vini, and a second electrode thereof is connected to the fourth node N4. A gate electrode of the sixth transistor T6 may be connected to the inverted emission line IEL to receive the inverted emission signal IEM. The sixth transistor T6 may be turned on according to the inverted emission signal IEM applied to the inverted emission line IEL to apply the initialization voltage Vini to the anode (fourth node N4) of the light emitting element LD. The sixth transistor T6 may be referred to as "initialization transistor."

A second capacitor C2 is connected between the inverted emission line IEL and the second node N2. When the inverted emission signal IEM is applied to the inverted emission line IEL, the second capacitor C2 may be formed to transmit a coupling voltage to the second node N2. The second capacitor C2 may be referred to as "coupling capacitor."

The anode of the light emitting element LD may be connected to the fourth node N4, and the cathode thereof may be connected to the low potential driving voltage VSS. When the driving transistor DT and the fourth transistor T4 are turned on, a current path may be formed between the high potential driving voltage VDD and the low potential driving voltage VSS to allow the driving current to flow to the light emitting element LD. The light emitting element LD may emit light with brightness corresponding to the magnitude of driving current applied.

In the embodiment shown in FIG. 5, the pixel circuit PX includes a low temperature polysilicon (LTPS) thin film transistor.

The LTPS thin film transistor includes a gate electrode, a source electrode, and a drain electrode. The LTPS thin film transistor has an active layer made of polysilicon. The LTPS thin film transistor may be formed as a p-type thin film transistor or an n-type thin film transistor. The LTPS thin film transistor has high electron mobility, and thus has fast driving characteristics.

However, the present embodiment is not limited thereto. In another embodiment, at least one of the transistors DT and T1 to T6 may be formed as an oxide semiconductor thin film transistor.

The oxide semiconductor thin film transistor includes a gate electrode, a source electrode, and a drain electrode. The oxide semiconductor thin film transistor has an active layer formed of an oxide semiconductor. Here, the oxide semiconductor may be set to an amorphous or crystalline oxide semiconductor. The oxide semiconductor thin film transistor may be formed as an n-type transistor. The oxide semiconductor thin film transistor may be processed at low temperatures and has lower charge mobility than the LTPS thin film transistor. The oxide semiconductor thin film transistor has excellent off-current characteristics.

Figure 6:
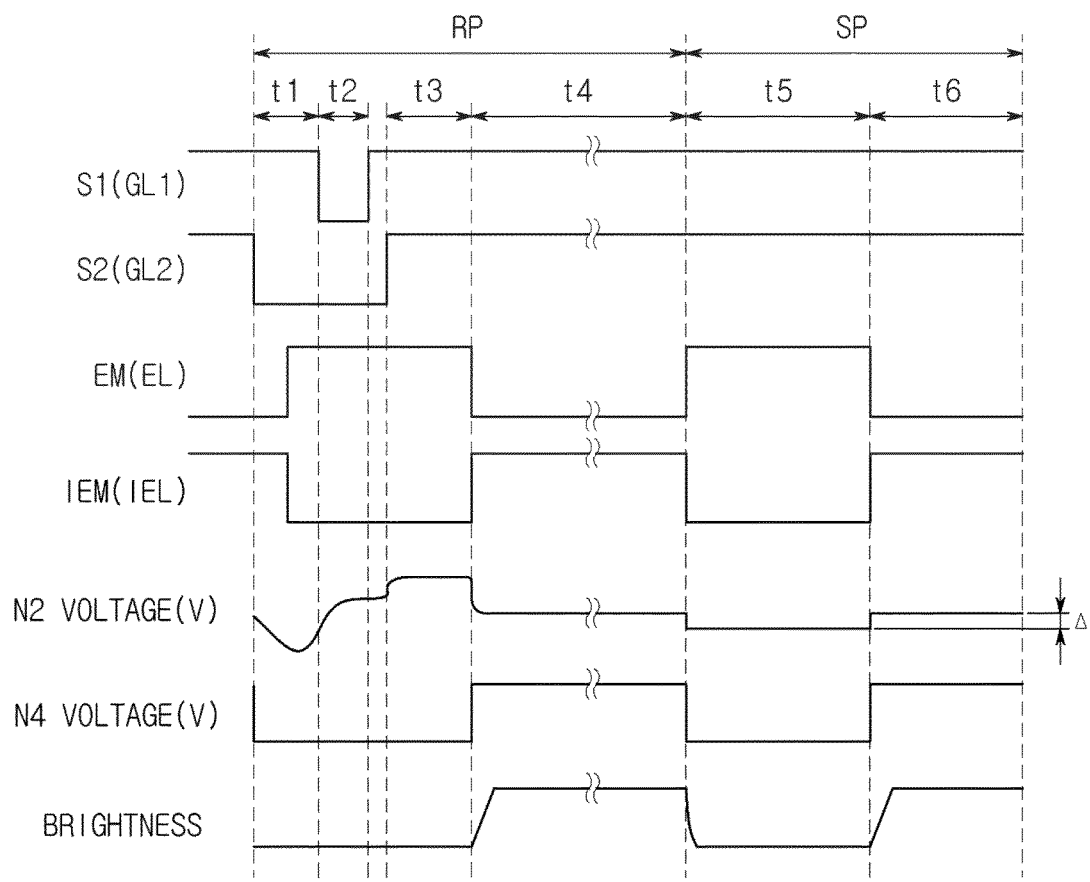
FIG. 6 is a view showing a method of driving the pixel shown in FIG. 5 according to the first embodiment of the present disclosure.

FIG. 6 is a view showing a method of driving the pixel shown in FIG. 5 according to the first embodiment of the present disclosure.

Referring to FIGS. 5 and 6, in the variable refresh rate mode, one frame may be configured in a combination of at least one refresh period RP and at least one skip period SP.

The refresh period RP may include an initialization period t1, a sampling period t2, a hold period t3, and an emission period t4.

During the initialization period t1, the second scan signal S2 at the turn-on level is applied to turn on the second transistor T2 and the fifth transistor T5. In addition, during the initialization period t1, the emission signal EM at the turn-on level is applied to turn on the third transistor T3 and the fourth transistor T4. Therefore, during the initialization period t1, the reference voltage Vref is applied to the first node N1, and the initialization voltage Vini is applied to the fourth node N4 and the third node N3.

When the second transistor T2 is turned on, a voltage at the third node N3 may be transmitted to the second node N2. Therefore, an initial voltage at the second node N2 may correspond to the initialization voltage Vini. During the initialization period t1, the first capacitor C1 may be gradually charged to a voltage corresponding to a difference between the reference voltage Vref and the initialization voltage Vini. In addition, during the initialization period t1, the voltage at the second node N2 may gradually reach the voltage corresponding to the difference between the reference voltage Vref and the initialization voltage Vini in response to the charging voltage of the first capacitor C1.

Meanwhile, during the initialization period t1, the anode of the light emitting element LD may be initialized to the initialization voltage Vini in response to a voltage at the fourth node N4.

During the sampling period t2, the first scan signal S1 at the turn-on level is further applied to turn on the first transistor T1. In addition, during the sampling period t2, the emission signal EM may be switched to the turn-off level to turn off the third transistor T3 and the fourth transistor T4. Conversely, during the sampling period t2, the inverted emission signal IEM is switched to the turn-on level. Then, the sixth transistor T6 may be turned on in response to the inverted emission signal IEM at the turn-on level. Therefore, during the sampling period t2, the data voltage Vdata applied to the data line DL is applied to the first node N1, and the initialization voltage Vini is applied to the fourth node N4.

During the sampling period t2, the first capacitor C1 may be gradually charged to a voltage corresponding to a difference between the data voltage Vdata and the initialization voltage Vini. In addition, during the sampling period t2, the voltage at the second node N2 may gradually reach the voltage corresponding to the difference between the data voltage Vdata and the initialization voltage Vini in response to the charging voltage of the first capacitor C1.

When the charging voltage of the first capacitor C1 is transmitted to the gate electrode of the driving transistor DT, a source-gate voltage of the driving transistor DT is higher than a threshold voltage Vth, and thus the driving transistor DT may be turned on. In this case, a source-drain current of the driving transistor DT may be determined according to the data voltage Vdata, the reference voltage Vref, the initialization voltage Vini, and the threshold voltage of the driving transistor DT.

The driving transistor DT may supply the source-drain current to the third node N3 when the source-gate voltage reaches the threshold voltage of the driving transistor DT. In addition, the second transistor T2 may supply the voltage at the third node N3 to the second node N2. In such a manner, while the driving transistor DT is turned on, the voltage at the second node N2 and the source-drain current of the driving transistor DT may be changed, and the voltage at the second node N2 may eventually converge to a voltage corresponding to a difference between the data voltage Vdata and the threshold voltage Vth of the driving transistor DT.

Meanwhile, during the sampling period t2, since the initialization voltage Vini is applied to the fourth node N4 through the sixth transistor T6, the anode of the light emitting element LD may maintain the initialization voltage Vini in response to the voltage at the fourth node N4.

During the hold period t3, the first scan signal S1 and the second scan signal S1 are switched to the turn-off level to turn off the first transistor T1, the second transistor T2, and the fifth transistor T5. During the hold period t3, the voltage at the second node N2 may be maintained stably through the first capacitor C1.

During the emission period t4, the emission signal EM at the turn-on level is applied to turn on the third transistor T3 and the fourth transistor T4. During the emission period t4, a current path from the high potential driving voltage VDD to the light emitting element LD via the driving transistor DT is formed. Therefore, a driving current with a magnitude corresponding to the voltage applied to the driving transistor DT may flow along the current path to allow the light emitting element LD to emit light with the corresponding brightness.

The skip period SP may include an anode initialization period t5 and an emission period t6.

During the anode initialization period t5, the emission signal EM may be switched to the turn-off level to turn off the third transistor T3 and the fourth transistor T4. Conversely, during the anode initialization period t5, the inverted emission signal IEM is switched to the turn-on level. Then, the sixth transistor T6 may be turned on in response to the inverted emission signal IEM at the turn-on level. Therefore, during the anode initialization period t5, the initialization voltage Vini is applied to the fourth node N4.

During the anode initialization period t5, the light emitting element LD does not emit light due to the initialization voltage Vini applied to the anode of the light emitting element LD. Instead, the voltage of the gate electrode of the driving transistor DT may be maintained at the voltage programmed during the previous refresh period RP by the first capacitor C1.

During the anode initialization period t5, when the inverted emission signal IEM is applied to the inverted emission line IEL, a parasitic capacitance (coupling voltage) may be generated in the second capacitor C2, and thus the voltage at the second node N2 may be decreased (kick backed) by a predetermined level A. When the source voltage of the driving transistor DT is maintained, a decrease in the voltage at the second node N2 increases the source-gate voltage of the driving transistor DT. Therefore, the driving transistor DT may maintain the turn-on state during the anode initialization period t5, and the hysteresis of the driving transistor DT may be decreased.

Meanwhile, during the anode initialization period t5, since the initialization voltage Vini is directly applied to the anode of the light emitting element LD, the voltage of the anode may be charged at a relatively fast rate, thereby minimizing or at least reducing the charging delay of the light emitting element LD. Through the anode initialization, deviation of the brightness integral amount according to the refresh rate does not occur, and flicker due to the difference in the brightness integral amount can be suppressed.

During the emission period t6, the emission signal EM at the turn-on level is applied to turn on the third transistor T3 and the fourth transistor T4. During the emission period t4, the light emitting element LD may emit light with the brightness corresponding to the voltage programmed during the previous refresh period RP.

Meanwhile, during the anode initialization period t5 before the emission period t6, the anode of the light emitting element LD is charged to the initialization voltage Vini. Therefore, during the emission period t6, the brightness of the light emitting element LD may reach a target brightness more quickly, thereby minimizing or at least reducing the charging delay of the light emitting element LD. In particular, since the initialization voltage Vini may be separated from the reference voltage Vref and supplied to the anode of the light emitting element LD, the voltage level of the initialization voltage Vini may be independently adjusted, and the charging and discharging delay timing of the light emitting element LD may be controlled effectively.

Figure 7:
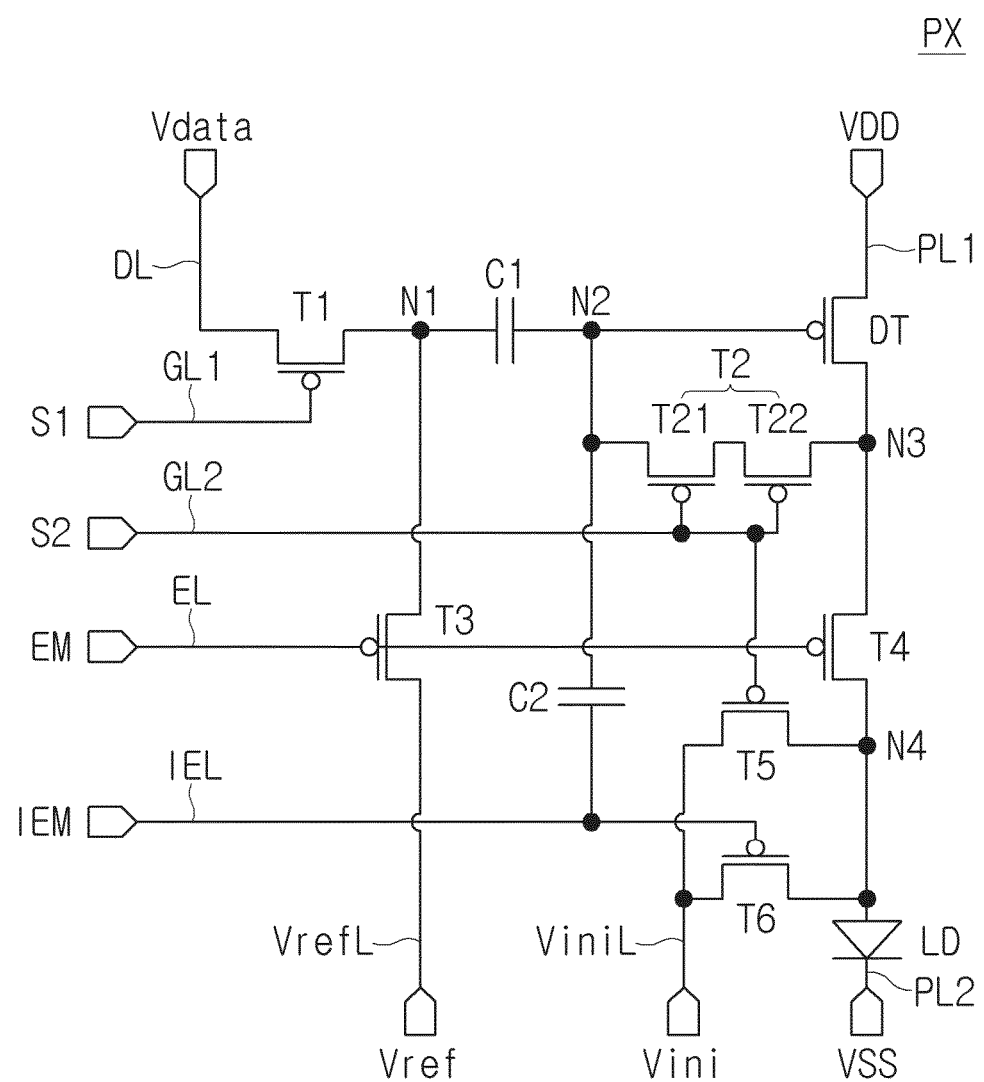
FIG. 7 is a circuit diagram of a pixel according to a second embodiment of the present disclosure.

FIG. 7 is a circuit diagram of a pixel according to a second embodiment of the present disclosure. In FIG. 7, for convenience of description, a pixel connected to a $n^{th}$ pixel row (n is an integer larger than 0) is shown as an example.

Compared to the first embodiment of FIG. 5, in the second embodiment, the second transistor T2 may be composed of a plurality of second sub-transistors T21 and T22 connected in series. Gate electrodes of the second sub-transistors T21 and T22 may be connected to the second gate line GL2 to receive the second scan signal S2. The second transistor T2 may be turned on according to the second scan signal S2 applied to the second gate line GL2 to electrically connect the gate electrode (second node N2) of the driving transistor DT with the second electrode (third node N3).

In the embodiment shown in FIG. 7, the second transistor T2 is formed of two sub-transistors T21 and T22, but the embodiment is not limited thereto. In another embodiment, the second transistor T2 may be formed of a larger number of sub-transistors.

Figure 8:
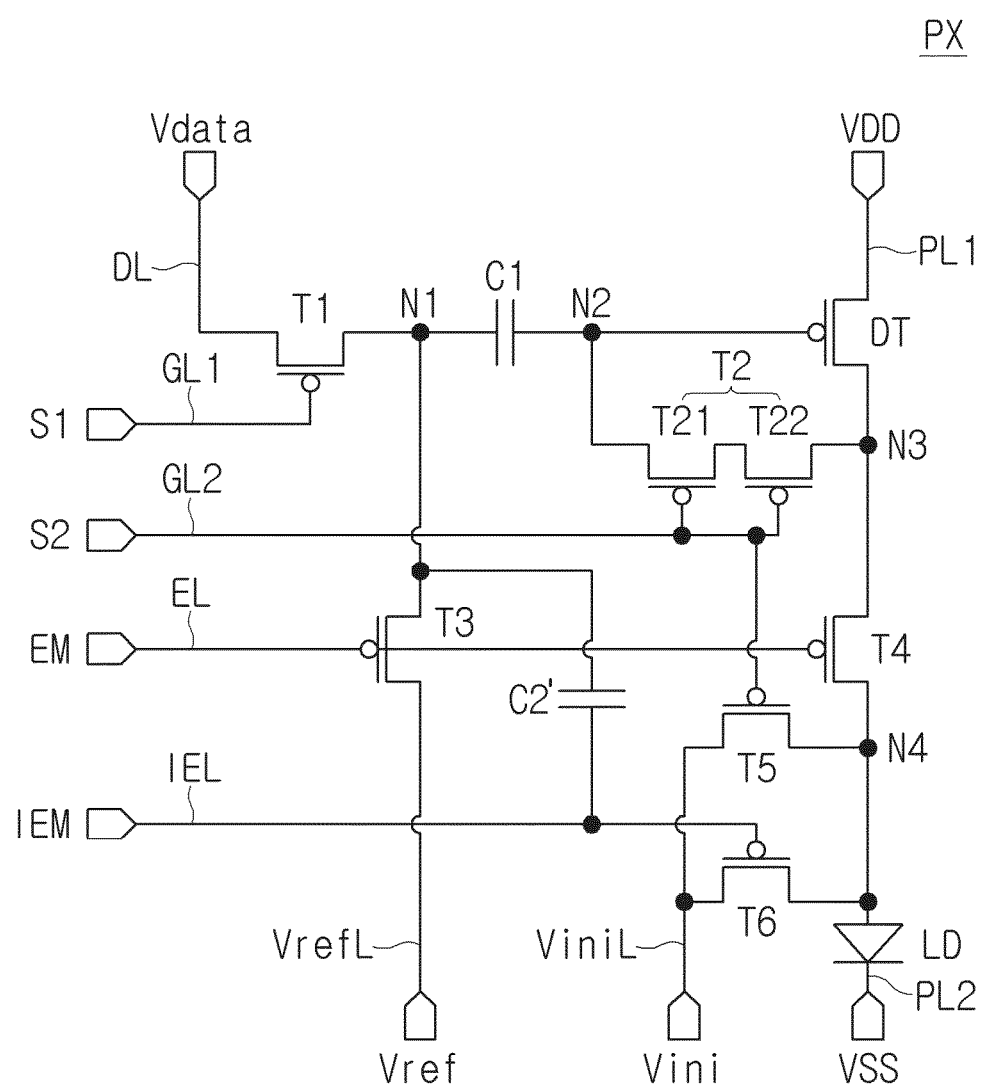
FIG. 8 is a circuit diagram of a pixel according to a third embodiment of the present disclosure.

FIG. 8 is a circuit diagram of a pixel according to a third embodiment of the present disclosure. In FIG. 8, for convenience of description, a pixel connected to a $n^{th}$ pixel row (n is an integer larger than 0) is shown as an example.

Referring to FIG. 8, the pixel circuit PX according to one or more embodiments may include a driving transistor DT, a light emitting element LD connected to the driving transistor DT, and a control circuit for controlling the magnitude of driving current to be applied to the light emitting element LD through the driving transistor DT. For example, the control circuit may include first to sixth transistors T1 to T6 and first and second capacitors C1 and C2'.

A first electrode of the driving transistor DT is connected to the high potential driving voltage VDD, and a second electrode thereof is connected to a third node N3. A gate electrode of the driving transistor DT is connected to a second node N2. The driving transistor DT may be turned on according to a voltage applied to the second node N2 to control the magnitude of driving current flowing to the light emitting element LD.

A first electrode of the first transistor T1 is connected to the data line DL, and a second electrode thereof is connected to a first node N1. A gate electrode of the first transistor T1 may be connected to the first gate line GL1 to receive the first scan signal S1. The first transistor T1 may be turned on according to the first scan signal S1 applied to the first gate line GL1 to transmit a data voltage Vdata applied to the data line DL to the first node N1. The first transistor T1 may be referred to as "first switching transistor."

The first capacitor C1 is connected between the first node N1 and the second node N2. The first capacitor C1 may store a voltage corresponding to a voltage difference between the first node N1 and the second node N2. For example, the first capacitor C1 may store a voltage corresponding to a difference between the data voltage Vdata applied to the data line DL and a voltage at the second node N2 and maintain the stored voltage for one frame period, thereby stabilizing the voltage of the gate electrode (i.e., the second node N2) of the driving transistor DT. The first transistor C1 may be referred to as "storage capacitor."

The second transistor T2 is connected between the second node N2 and the third node N3. A gate electrode of the second transistor T2 may be connected to the second gate line GL2 to receive the second scan signal S2. The second transistor T2 may be turned on according to the second scan signal S2 applied to the second gate line GL2 to electrically connect the gate electrode (second node N2) of the driving transistor DT with the second electrode (third node N3). The second transistor T2 may be referred to as "second switching transistor."

A first electrode of the third transistor T3 is formed to receive the reference voltage Vref, and a second electrode thereof is connected to the first node N1. A gate electrode of the third transistor T3 may be connected to the emission line EL to receive the emission signal EM. The third transistor T3 may be turned on according to the emission signal EM applied to the emission line EL to transmit the reference voltage Vref to the first node N1. The third transistor T3 may be referred to as "third switching transistor."

The fourth transistor T4 is connected between the third node N3 and a fourth node N4. A gate electrode of the fourth transistor T4 may be connected to the emission line EL to receive the emission signal EM. The fourth transistor T4 may be turned on according to the emission signal EM applied to the emission line EL to electrically connect the driving transistor DT (third node N3) with the light emitting element LD (fourth node N4). The fourth transistor T4 may be referred to as "light emitting transistor."

A first electrode of the fifth transistor T5 is formed to receive the initialization voltage Vini, and a second electrode thereof is connected to the fourth node N4. A gate electrode of the fifth transistor T5 may be connected to the second gate line GL2 to receive the second scan signal S2. The fifth transistor T5 may be turned on according to the second scan signal S2 applied to the second gate line GL2 to apply the initialization voltage Vini to the anode (fourth node N4) of the light emitting element LD. The fifth transistor T5 may be referred to as "fourth switching transistor."

A first electrode of the sixth transistor T6 is formed to receive the initialization voltage Vini, and a second electrode thereof is connected to the fourth node N4. A gate electrode of the sixth transistor T6 may be connected to the inverted emission line IEL to receive the inverted emission signal IEM. The sixth transistor T6 may be turned on according to the inverted emission signal IEM applied to the inverted emission line IEL to apply the initialization voltage Vini to the anode (fourth node N4) of the light emitting element LD. The sixth transistor T6 may be referred to as "anode initialization transistor."

The second capacitor C2' is connected between the inverted emission line IEL and the first node N1. When the inverted emission signal IEM is applied to the inverted emission line IEL, the second capacitor C2' may be formed to transmit a coupling voltage to the first node N1. The second capacitor C2' may be referred to as "coupling capacitor."

The anode of the light emitting element LD may be connected to the fourth node N4, and the cathode thereof may be connected to the low potential driving voltage VSS. When the driving transistor DT and the fourth transistor T4 are turned on, a current path may be formed between the high potential driving voltage VDD and the low potential driving voltage VSS to allow the driving current to flow to the light emitting element LD. The light emitting element LD may emit light with brightness corresponding to the magnitude of driving current applied.

Figure 9:
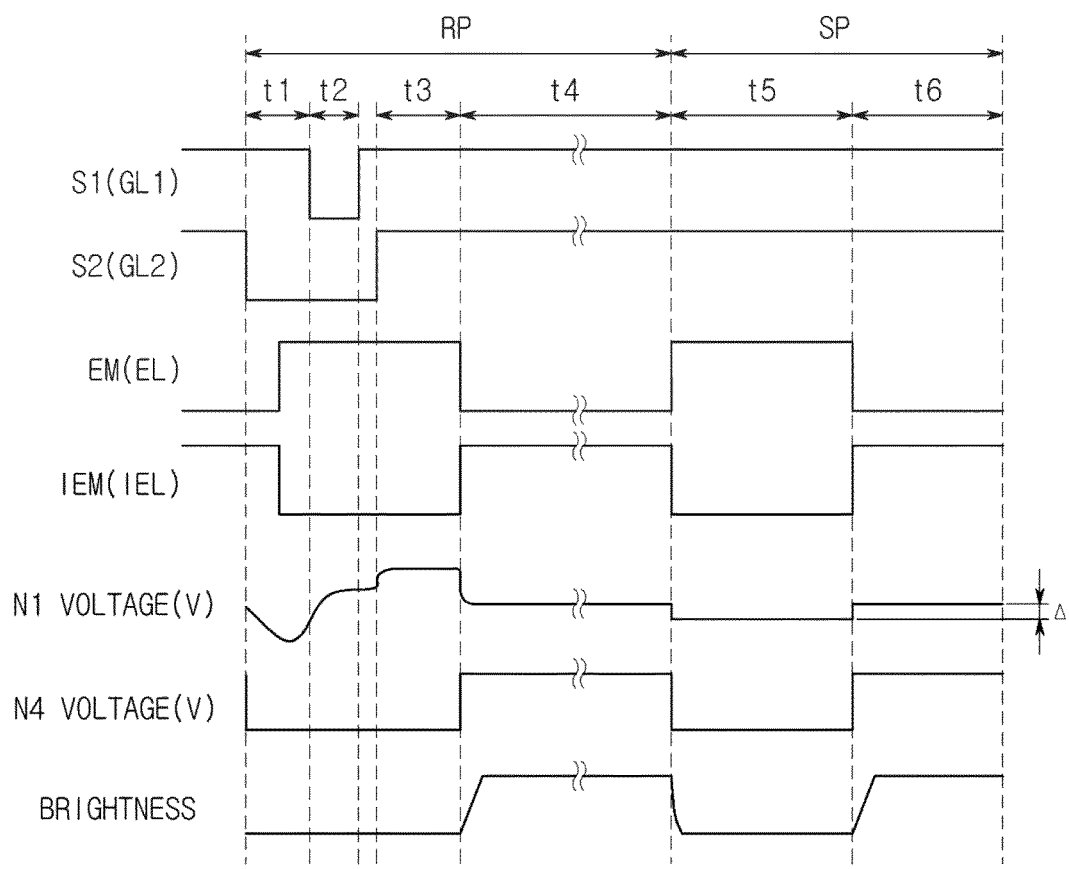
FIG. 9 is a view showing a method of driving the pixel shown in FIG. 8 according to the third embodiment of the present disclosure.

FIG. 9 is a view showing a method of driving the pixel shown in FIG. 8 according to the third embodiment of the present disclosure.

Referring to FIG. 9, in the variable refresh rate mode, one frame may be configured in a combination of at least one refresh period RP and at least one skip period SP.

The refresh period RP may include an initialization period t1, a sampling period t2, a hold period t3, and an emission period t4.

During the initialization period t1, the second scan signal S2 at the turn-on level is applied to turn on the second transistor T2 and the fifth transistor T5. In addition, during the initialization period t1, the emission signal EM at the turn-on level is applied to turn on the third transistor T3 and the fourth transistor T4. Therefore, during the initialization period t1, the reference voltage Vref is applied to the first node N1, and the initialization voltage Vini is applied to the fourth node N4 and the third node N3.

When the second transistor T2 is turned on, a voltage at the third node N3 may be transmitted to the second node N2. Therefore, an initial voltage at the second node N2 may correspond to the initialization voltage Vini. During the initialization period t1, the first capacitor C1 may be gradually charged to a voltage corresponding to a difference between the reference voltage Vref and the initialization voltage Vini. In addition, during the initialization period t1, the voltage at the second node N2 may gradually reach the voltage corresponding to the difference between the reference voltage Vref and the initialization voltage Vini in response to the charging voltage of the first capacitor C1.

Meanwhile, during the initialization period t1, the anode of the light emitting element LD may be initialized to the initialization voltage Vini in response to a voltage at the fourth node N4.

During the sampling period t2, the first scan signal S1 at the turn-on level is further applied to turn on the first transistor T1. In addition, during the sampling period t2, the emission signal EM may be switched to the turn-off level to turn off the third transistor T3 and the fourth transistor T4. Conversely, in the sampling period t2, the inverted emission signal IEM is switched to the turn-on level. Then, the sixth transistor T6 may be turned on in response to the inverted emission signal IEM at the turn-on level. Therefore, during the sampling period t2, the data voltage Vdata applied to the data line DL is applied to the first node N1, and the initialization voltage Vini is applied to the fourth node N4.

During the sampling period t2, the first capacitor C1 may be gradually charged to a voltage corresponding to a difference between the data voltage Vdata, and the initialization voltage Vini. In addition, during the sampling period t2, the voltage at the second node N2 may gradually reach the voltage corresponding to the difference between the data voltage Vdata and the initialization voltage Vini in response to the charging voltage of the first capacitor C1.

When the charging voltage of the first capacitor C1 is transmitted to the gate electrode of the driving transistor DT, a source-gate voltage of the driving transistor DT is higher than a threshold voltage Vth, and thus the driving transistor DT may be turned on. In this case, a source-drain current of the driving transistor DT may be determined according to the data voltage Vdata, the reference voltage Vref, the initialization voltage Vini, and the threshold voltage of the driving transistor DT.

The driving transistor DT may supply the source-drain current to the third node N3 when the source-gate voltage reaches the threshold voltage of the driving transistor DT. In addition, the second transistor T2 may supply the voltage at the third node N3 to the second node N2. In such a manner, while the driving transistor DT is turned on, the voltage at the second node N2 and the source-drain current of the driving transistor DT may be changed, and the voltage at the second node N2 may eventually converge to a voltage corresponding to a difference between the data voltage Vdata and the threshold voltage Vth of the driving transistor DT.

Meanwhile, during the sampling period t2, since the initialization voltage Vini is applied to the fourth node N4 through the sixth transistor T6, the anode of the light emitting element LD may maintain the initialization voltage Vini in response to the voltage at the fourth node N4.

During the hold period t3, the first scan signal S1 and the second scan signal S1 are switched to the turn-off level to turn off the first transistor T1, the second transistor T2, and the fifth transistor T5. During the hold period t3, the voltage at the second node N2 may be maintained stably through the first capacitor C1.

During the emission period t4, the emission signal EM at the turn-on level is applied to turn on the third transistor T3 and the fourth transistor T4. During the emission period t4, a current path from the high potential driving voltage VDD to the light emitting element LD via the driving transistor DT is formed. Therefore, a driving current with a magnitude corresponding to the voltage programmed into the driving transistor DT may flow along the current path to allow the light emitting element LD to emit light with the corresponding brightness.

The skip period SP may include an anode initialization period t5 and an emission period t6.

During the anode initialization period t5, the emission signal EM may be switched to the turn-off level to turn off the third transistor T3 and the fourth transistor T4. Conversely, during the anode initialization period t5, the inverted emission signal IEM is switched to the turn-on level. Then, the sixth transistor T6 may be turned on in response to the inverted emission signal IEM at the turn-on level. Therefore, during the anode initialization period t5, the initialization voltage Vini is applied to the fourth node N4.

During the anode initialization period t5, the light emitting element LD does not emit light due to the initialization voltage Vini applied to the anode of the light emitting element LD. Instead, the voltage of the gate electrode of the driving transistor DT may be maintained at the voltage programmed during the previous refresh period RP by the first capacitor C1.

During the anode initialization period t5, when the inverted emission signal IEM is applied to the inverted emission line IEL, a parasitic capacitance (coupling voltage) may be generated in the second capacitor C2', and thus the voltage at the second node N1 may be decreased (kick backed) by a predetermined level A. When the source voltage of the driving transistor DT is maintained, a decrease in the voltage at the first node N1 increases the source-gate voltage of the driving transistor DT. Therefore, the driving transistor DT may maintain the turn-on state during the anode initialization period t5, and the hysteresis of the driving transistor DT may be decreased.

Meanwhile, during the anode initialization period t5, since the initialization voltage Vini is directly applied to the anode of the light emitting element LD, the voltage of the anode may be charged at a relatively fast rate, thereby minimizing or at least reducing the charging delay of the light emitting element LD. Through the anode initialization, deviation of the brightness integral amount according to the refresh rate does not occur, and flicker due to the difference in the brightness integral amount can be suppressed.

During the emission period t6, the emission signal EM at the turn-on level is applied to turn on the third transistor T3 and the fourth transistor T4. During the emission period t4, the light emitting element LD may emit light with the brightness corresponding to the voltage programmed during the previous refresh period RP.

Meanwhile, during the anode initialization period t5 before the emission period t6, the anode of the light emitting element LD is charged to the initialization voltage Vini. Therefore, during the emission period t6, the brightness of the light emitting element LD may reach the target brightness more quickly, thereby minimizing or at least reducing charging delay of the light emitting element LD. In particular, since the initialization voltage Vini may be separated from the reference voltage Vref and supplied to the anode of the light emitting element LD, the voltage level of the initialization voltage Vini may be independently adjusted, and the charging and discharging delay timing of the light emitting element LD may be controlled effectively.

Figure 10:
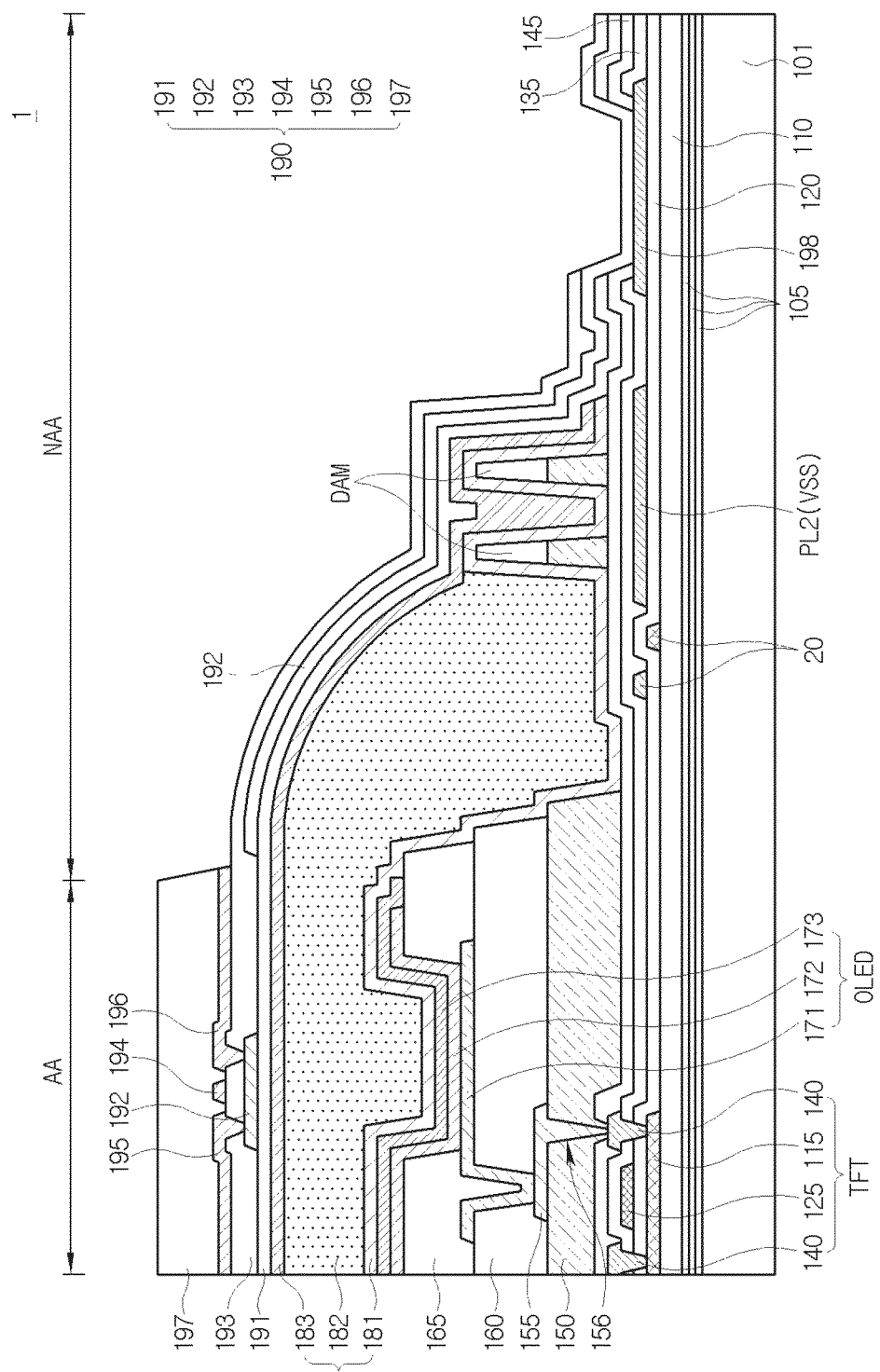
FIG. 10 is a cross-sectional view showing a stacked form of the display device according to one or more embodiments of the present disclosure.

FIG. 10 is a cross-sectional view showing a stacked form of the display device according to one or more embodiments.

Referring to FIG. 10, a thin film transistor TFT for driving a light emitting element LD may be disposed on a substrate 101 in the display area AA. In FIG. 10, for convenience of description, only the driving transistor DT (see FIG. 5) among various thin film transistors that may be included in the display device 1 is shown, but the thin film transistor TFT is not limited thereto. Hereinafter, although an example in which the thin film transistor TFT has a coplanar structure will be described, the thin film transistor TFT can be implemented in any of various other structures, such as a staggered structure.

The driving transistor DT may control the current supplied from the high potential driving voltage VDD to the light emitting element LD in response to the data signal supplied to a gate electrode 125. Therefore, the driving transistor DT may control the intensity of light emitted from the light emitting element LD. In this case, a constant current may be supplied to the light emitting element LD until a data signal of the next frame is supplied by the voltage charged in the storage capacitor (e.g., the first capacitor C1 in FIG. 5), and thus the emitting state of the light emitting element LD may be maintained. The high potential driving voltage line PL1 (see FIG. 1) that supplies the high potential driving voltage VDD may be formed parallel to the data line DL (see FIG. 1).

The thin film transistor TFT may include a semiconductor layer 115 disposed on a first insulating layer 110, a gate electrode 125 overlapping the semiconductor layer 115 with the second insulating layer 120 interposed therebetween, and source and drain electrodes 140 formed on a third insulating layer 135 and in contact with the semiconductor layer 115.

The semiconductor layer 115 may be an area in which a channel is formed when the thin film transistor TFT is driven. The semiconductor layer 115 may be formed of an oxide semiconductor, amorphous silicon (a-Si), polycrystalline silicon (poly-Si), or various organic semiconductors, such as pentacene, but is not limited thereto.

The semiconductor layer 115 may be formed on the first insulating layer 110. The semiconductor layer 115 may include a channel area, a source area, and a drain area. The channel area may overlap the gate electrode 125 with the first insulating layer 110 interposed therebetween to form the channel area between the source and drain electrodes 140. The source area is electrically connected to the source electrode 140 through a contact hole passing through the second insulating layer 120 and the third insulating layer 135. The drain area is electrically connected to the drain electrode 140 through a contact hole passing through the second insulating layer 120 and the third insulating layer 135.

A buffer layer 105 and the first insulating layer 110 may be disposed between the semiconductor layer 115 and the substrate 101. The buffer layer 105 may delay the diffusion of moisture and/or oxygen that has permeated the substrate 101. The first insulating layer 110 can protect the semiconductor layer 115 and block various types of impurity introduced from the substrate 101.

An uppermost layer of the buffer layer 105 in contact with the first insulating layer 110 may be made of a material with different etching characteristics from the remaining layers of the buffer layer 105, the first insulating layer 110, the second insulating layer 120, and the third insulating layer 135. The uppermost layer of the buffer layer 105 in contact with the first insulating layer 110 may be made of any one of silicon nitride ($SiN_x$) and silicon oxide ($SiO_x$). The remaining layers of the buffer layer 105, the first insulating layer 110, the second insulating layer 120, and the third insulating layer 135 may be made of the other of silicon nitride ($SiN_x$) and silicon oxide ($SiO_x$). For example, the uppermost layer of the buffer layer 105 in contact with the first insulating layer 110 may be made of silicon nitride ($SiN_x$), and the remaining layers of the buffer layer 105, the first insulating layer 110, the second insulating layer 120, and the third insulating layer 135 may be made of silicon oxide ($SiO_x$), but are not limited thereto.

The gate electrode 125 may be formed on the second insulating layer 120 and may overlap the channel area of the semiconductor layer 115 with the second insulating layer 120 interposed therebetween. The gate electrode 125 may be made of a first conductive material, which is a single layer or a multi-layer made of one or more of magnesium (Mg), molybdenum (Mo), aluminum (Al), chromium (Cr), gold (Au), titanium (Ti), nickel (Ni), neodymium (Nd), and copper (Cu) or an alloy thereof, but is not limited thereto.

The source electrode 140 may be connected to the source area of the semiconductor layer 115 exposed through the contact hole passing through the second insulating layer 120 and the third insulating layer 135. The drain electrode 140 may face the source electrode 140 and may be connected to the drain area of the semiconductor layer 115 through the contact hole passing through the second insulating layer 120 and the third insulating layer 135. The source and drain electrodes 140 may be made of a second conductive material, which is a single layer or a multi-layer made of one or more of molybdenum (Mo), aluminum (Al), chromium (Cr), gold (Au), titanium (Ti), nickel (Ni), neodymium (Nd), and copper (Cu) or two or more alloys, but is not limited thereto.

A connection electrode 155 may be disposed between a first intermediate layer 150 and a second intermediate layer 160. The connection electrode 155 may be exposed through a connection electrode contact hole 156 passing through a protective film 145 and the first intermediate layer 150 and connected to the drain electrode 140. The connection electrode 155 may be made of a material with low specific resistance that is the same as or similar to that of the drain electrode 140, but is not limited thereto.

The light emitting element LD including an light emitting layer 172 may be disposed on the second intermediate layer 160 and a bank layer 165. The light emitting element LD may include an anode 171, at least one light emitting layer 172 formed on the anode 171, and a cathode 173 formed on the light emitting layer 172.

The anode 171 may be disposed on the first intermediate layer 150 through the contact hole passing through the second intermediate layer 160 and electrically connected to the connection electrode 155 exposed upward from the second intermediate layer 160.

The anode 171 of each pixel is formed to be exposed by the bank layer 165. The bank layer 165 may be made of an opaque material (e.g., black) to prevent light interference between adjacent pixels. In this case, the bank layer 165 may include a light blocking material made of at least any one of color pigment, organic black, and carbon, but is not limited thereto.

At least one light emitting layer 172 may be formed on the anode 171 in an emission area defined by the bank layer 165. At least one light emitting layer 172 may include a hole injection layer, a hole transport layer, a light emitting layer, an electron transport layer, and an electron injection layer on the anode 171 and the above layers may be formed to be stacked sequentially or reversely in an emission direction. In addition, the light emitting layer 172 may include first and second emission stacks that face each other with a charge generation layer interposed therebetween. In this case, since the light emitting layer 172 of any one of the first and second emission stacks may generate blue light, and the light emitting layer 172 of the other of the first and second emission stacks may generate yellow-green light, white light may be generated through the first and second emission stacks. White light emitted from the emission stacks is incident on color filters positioned above or under the light emitting layer 172, color images can be implemented. As another example, the color images can be implemented by emitting color light corresponding to each pixel from each light emitting layer 172 without a separate color filter. For example, the light emitting layer 172 of a red pixel may emit red light, the light emitting layer 172 of a green pixel may emit green light, and the light emitting layer 172 of a blue pixel may emit blue light.

The cathode 173 may be formed opposite to the anode 171 with the light emitting layer 172 interposed therebetween and may receive the high potential driving voltage VDD.

An encapsulation layer 180 may block the introduction of external moisture or oxygen into the light emitting element LD vulnerable to external moisture or oxygen. To this end, the encapsulation layer 180 may include at least one inorganic encapsulation layer and at least one organic encapsulation layer, but is not limited thereto. Hereinafter, a structure of the encapsulation layer 180 in which a first encapsulation layer 181, a second encapsulation layer 182, and a third encapsulation layer 183 are sequentially stacked will be described as an example.

The first encapsulation layer 181 is formed on the substrate 101 on which the cathode 173 is formed. The third encapsulation layer 183 may be formed on the substrate 101 on which the second encapsulation layer 182 is formed and formed to surround an upper surface, a lower surface, and side surfaces of the second encapsulation layer 182 together with the first encapsulation layer 181. The first encapsulation layer 181 and the third encapsulation layer 183 can minimize, at least reduce, or prevent external moisture or oxygen from flowing into the light emitting element LD. The first encapsulation layer 181 and the third encapsulation layer 183 may be made of an inorganic insulating material capable of low-temperature deposition, such as silicon nitride ($SiN_x$), silicon oxide ($SiO_x$), silicon oxynitride (SiON), or aluminum oxide ($Al_2O_3$). Since the first encapsulation layer 181 and the third encapsulation layer 183 are deposited in a low temperature atmosphere, it is possible to prevent damage to the light emitting element LD vulnerable to a high temperature atmosphere in a deposition process of the first encapsulation layer 181 and the third encapsulation layer 183.

The second encapsulation layer 182 may function as a buffer for mitigating stress between the layers due to the bending of the display apparatus 1 and planarize step differences between the layers. The second encapsulation layer 182 may be formed on the substrate 101 on which the first encapsulation layer 181 is formed with a non-photosensitive organic insulating material such as acrylic resin, epoxy resin, phenolic resin, polyamide resin, polyimide resin, and polyethylene or silicon oxycarbon (SiOC), or a photosensitive organic insulating material such as photoacrylic, but is not limited thereto. When the second encapsulation layer 182 is formed through an inkjet method, a dam DAM may be disposed to prevent the second encapsulation layer 182 in a liquid form from spreading to an edge of the substrate 101. The dam DAM may be disposed closer to the edge of the substrate 101 than the second encapsulation layer 182. The dam DAM can prevent the second encapsulation layer 182 from spreading to a pad area in which a conductive pad disposed at an outermost side of the substrate 101 is disposed.

The dam DAM may be designed to prevent the spreading of the second encapsulation layer 182, but when the second encapsulation layer 182 is formed to exceed a height of the dam DAM in the process, the second encapsulation layer 182, which is an organic layer, may be exposed to the outside, and thus moisture or the like may easily flow into the light emitting element. Therefore, to prevent the same, at least 2 dams DAM may be formed.

The dam DAM may be disposed on the protective film 145 in the non-display area NAA. In addition, the dam DAM may be formed simultaneously with the first intermediate layer 150 and the second intermediate layer 160. When the first intermediate layer 150 is formed, a lower layer of the dam DAM may be formed together, and when the second intermediate layer 160 is formed, an upper layer of the dam DAM may be formed together, and thus the dam DAM may be formed by being stacked in a double structure. Therefore, the dam DAM may be made of the same material as the first intermediate layer 150 and the second intermediate layer 160, but is not limited thereto.

The dam DAM may be formed to overlap the low potential driving voltage line PL2. For example, the low potential driving voltage line PL2 may be formed on a lower layer of an area in which the dam DAM is positioned in the non-display area NAA.

The low potential driving voltage line PL2 and the gate driver 20 formed in the form of the GIP may be formed in the form of surrounding an outer side of the display panel, and the low potential driving voltage line PL2 may be positioned outside the gate driver 20. In addition, the low potential driving voltage line PL2 may be connected to the anode 171 to apply a common voltage. The gate driver 20 is briefly shown in plan and cross-sectional views, but may be configured using a thin film transistor TFT with the same structure as the thin film transistors TFT in the display area AA.

The low potential driving voltage line PL2 is disposed outside the gate driver 20. The low potential driving voltage line PL2 is disposed outside the gate driver 20 and surrounds the display area AA. The low potential driving voltage line PL2 may be made of the same material as the source and drain electrodes 140 of the thin film transistor TFT, but is not limited thereto. For example, the low potential driving voltage line PL2 may be made of the same material as the gate electrode 125.

In addition, the low potential driving voltage line PL2 may be electrically connected to the anode 171. The low potential driving voltage line PL2 may supply the low potential driving voltage VSS to the plurality of pixels in the display area AA.

A touch layer 190 may be disposed on the encapsulation layer 180. In the touch layer 190, a touch buffer film 191 may be positioned between a touch sensor metal including touch electrode connection lines 192 and 194 and touch electrodes 195 and 196 and the cathode 173 of the light emitting element LD.

The touch buffer film 191 can block a chemical solution (developer, etchant, or the like) used in a process of manufacturing the touch sensor metal disposed on the touch buffer film 191 or external moisture or the like from flowing into the light emitting layer 172 including the organic material. Therefore, the touch buffer film 191 can prevent damage to the light emitting layer 172 vulnerable to a chemical solution or moisture.

The touch buffer layer 191 may be formed at a predetermined temperature (e.g., a low temperature of 100° C. or lower) to prevent damage to the light emitting layer 172 containing an organic material vulnerable to high temperatures and made of an organic insulating material with a low dielectric constant of 1 to 3. For example, the touch buffer film 191 may be made of an acrylic-based, epoxy-based, or siloxan-based material. The touch buffer film 191 made of an organic insulating material and having planarization performance can prevent damage to the encapsulation layer 180 due to the bending of an organic light emitting diode display device and cracking of the touch sensor metal formed on the touch buffer film 191.

According to the mutual-capacitance-based touch sensor structure, the touch electrodes 195 and 196 may be disposed on the touch buffer film 191, and the touch electrodes 195 and 196 may be disposed to cross each other.

The touch electrode connection lines 192 and 194 may electrically connect the touch electrodes 195 and 196. The touch electrode connection lines 192 and 194 and the touch electrodes 195 and 196 may be positioned on different layers with the touch insulating film 193 interposed therebetween.

The touch electrode connection lines 192 and 194 may be disposed to overlap the bank layer 165, thereby preventing a reduction in an aperture ratio.

Meanwhile, a portion of the touch electrode connection line 192 may be electrically connected to a touch driving circuit (not shown) through a touch pad 198 after passing an upper portion and a side surface of the encapsulation layer 180 and an upper portion and a side surface of the dam DAM.

The portion of the touch electrode connection line 192 may transmit the touch driving signal to the touch electrodes 195 and 196 after receiving a touch driving signal from the touch driving circuit and transmit touch sensing signals from the touch electrodes 195 and 196 to the touch driving circuit.

A touch protective film 197 may be disposed on the touch electrodes 195 and 196. In the drawing, the touch protective film 197 is illustrated as being disposed only on the touch electrodes 195 and 196, but is not limited thereto, and the touch protective film 197 may extend to an area before or after the dam DAM and may be disposed on the touch electrode connection line 192.

In addition, a color filter (not shown) may be further disposed on the encapsulation layer 180, and the color filter may be positioned on the touch layer or positioned between the encapsulation layer 180 and the touch layer 190.

The pixel and the display device including the same according to the embodiments of the present disclosure can prevent the charging delay of the light emitting element upon the low-frequency driving in the variable refresh rate mode and adjust the characteristics and on-bias stress of the driving transistor.

The pixel and the display device including the same according to the embodiments of the present disclosure can minimize or at least reduce the flicker phenomenon in the variable refresh rate mode and uniformly control the overall brightness.

The pixel and the display device including the same according to the embodiments of the present disclosure have the hybrid form capable of minimizing or at least reducing the leakage current using the oxide semiconductor thin transistor.

Although the embodiments of the present disclosure have been described above with reference to the accompanying drawings, those skilled in the art to which the present disclosure pertains will be able to understand that the above-described technical configuration of the present disclosure can be carried out in other specific forms without changing the technical spirit or essential features thereof. Therefore, it should be understood that the above-described embodiments are illustrative and not restrictive in all respects. In addition, the scope of the present disclosure is described by the claims to be described below rather than the detailed description. In addition, the meaning and scope of the claims and all changed or modified forms derived from the equivalent concept should be construed as being included in the scope of the present disclosure.

What is claimed is:

1. A pixel circuit, comprising:
a light emitting element having an anode;
a driving transistor having a first electrode connected to a high potential driving voltage line, a second electrode electrically connected to the light emitting element, and a gate electrode, the driving transistor configured to control a magnitude of driving current supplied to the light emitting element in response to a voltage applied to the gate electrode of the driving transistor;
a first switching transistor having a gate electrode, the first switching transistor electrically connected between a data line and the gate electrode of the driving transistor, the first switching transistor configured to receive a first scan signal through the gate electrode of the first switching transistor;
a light emitting transistor having a gate electrode, the light emitting transistor connected between the driving transistor and the light emitting element, the light emitting transistor configured to receive an emission signal through the gate electrode of the light emitting transistor; and
an initialization transistor having a gate electrode, the initialization transistor connected between an initialization voltage line and the anode of the light emitting element, the initialization transistor configured to receive an inverted emission signal through the gate electrode of the initialization transistor, the inverted emission signal having a phase opposite to a phase of the emission signal.

2. The pixel circuit of claim 1, wherein, in a variable refresh rate mode, the pixel circuit is driven at a frequency where one frame includes an anode initialization period and an emission period,
wherein, during the anode initialization period, the emission signal is applied at a turn-off level,
wherein, during the emission period, the emission signal is applied at a turn-on level, and
wherein, during the anode initialization period, the initialization transistor applies an initialization voltage to the anode of the light emitting element in response to the inverted emission signal.

3. The pixel circuit of claim 2, further comprising:
a coupling capacitor connected between an inverted emission signal line to which the inverted emission signal is applied and the gate electrode of the driving transistor.

4. The pixel circuit of claim 3, wherein the coupling capacitor transmits, during the anode initialization period, a coupling voltage corresponding to the inverted emission signal to the gate electrode of the driving transistor.

5. The pixel circuit of claim 2, further comprising:
a storage capacitor having a first node and a second node, the storage capacitor connected to the first switching transistor through the first node and to the gate electrode of the driving transistor through the second node.

6. The pixel circuit of claim 5, further comprising:
a coupling capacitor connected between an inverted emission signal line to which the inverted emission signal is applied and the first node.

7. The pixel circuit of claim 5, further comprising:
a second switching transistor having a gate electrode, the second switching transistor connected between the gate electrode of the driving transistor and the second electrode of the driving transistor, the second switching transistor configured to receive a second scan signal through the gate electrode of the second switching transistor;
a third switching transistor having a gate electrode, the third switching transistor connected between a reference voltage line and the first node, the third switching transistor configured to receive the emission signal through the gate electrode of the third switching transistor; and
a fourth switching transistor having a gate electrode, the fourth switching transistor connected between the initialization voltage line and the anode of the light emitting element, the fourth switching transistor configured to receive the second scan signal through the gate electrode of the third switching transistor.

8. The pixel circuit of claim 7, wherein the second switching transistor comprises a plurality of sub-transistors connected in series, the plurality of sub-transistors include a plurality of gate electrodes, and the plurality of sub-transistors receive the second scan signal through the plurality of gate electrodes.

9. A display device, comprising:
a display panel including a display area with a plurality of pixel circuits in the display area, and a non-display area adjacent to the display area;
at least one gate driver configured to apply a first scan signal, an emission signal, and an inverted emission signal to the plurality of pixel circuits, the inverted emission signal having a phase opposite to a phase of the emission signal;
a data driver configured to apply a data voltage to the plurality of pixel circuits;
a power supply unit configured to apply a voltage for driving the plurality of pixel circuits; and
a timing controller configured to control driving timing of the display panel,
wherein a pixel circuit of the plurality of pixel circuits includes:
a light emitting element having an anode;
a driving transistor having a first electrode connected to a high potential driving voltage line, a second electrode electrically connected to the light emitting element, and a gate electrode, the driving transistor configured to control a magnitude of driving current supplied to the light emitting element in response to a voltage applied to the gate electrode of the driving transistor;
a first switching transistor configured to transmit the data voltage to the gate electrode of the driving transistor in response to the first scan signal;
a light emitting transistor configured to form a current path between the driving transistor and the light emitting element in response to the emission signal; and
an initialization transistor configured to transmit an initialization voltage to the anode of the light emitting element in response to the inverted emission signal.

10. The display device of claim 9, wherein the at least one gate driver includes a plurality of gate drivers configured symmetrically at each of a first side of the non-display area and a second side of the non-display area.

11. The display device of claim 10, wherein each of the plurality of gate drivers includes:
a first shift register configured to output the first scan signal;
a second shift register configured to output a second scan signal;
a third shift register configured to output the emission signal; and
a fourth shift register configured to output the inverted emission signal.

12. The display device of claim 11, wherein the fourth shift register is closer to the display area than the third shift register, and the fourth shift register is configured to:
receive the emission signal output from the third shift register to the plurality of pixel circuits; and
invert a phase of the received emission signal to generate the inverted emission signal.

13. The display device of claim 9, wherein, in a variable refresh rate mode, the timing controller drives the pixel circuit at a frequency where one frame includes an anode initialization period and an emission period,
wherein, during the anode initialization period, the at least one gate driver applies the emission signal at a turn-off level to the plurality of pixel circuits,
wherein, during the emission period, the at least one gate driver applies the emission signal at a turn-on level to the plurality of pixel circuits, and
wherein, during the anode initialization period, the initialization transistor applies the initialization voltage to the anode of the light emitting element in response to the inverted emission signal.

14. The display device of claim 13, wherein the pixel circuit further includes a coupling capacitor connected between an inverted emission signal line to which the inverted emission signal is applied and the gate electrode of the driving transistor.

15. The display device of claim 14, wherein the coupling capacitor transmits, during the anode initialization period, a coupling voltage corresponding to the inverted emission signal to the gate electrode of the driving transistor.

16. The display device of claim 13, wherein the pixel circuit further includes a storage capacitor having a first node and a second node, the storage capacitor connected to the first switching transistor through the first node and to the gate electrode of the driving transistor through the second node.

17. The display device of claim 16, wherein the pixel circuit further includes a coupling capacitor connected between an inverted emission signal line to which the inverted emission signal is applied and the first node.

18. The display device of claim 16, wherein the pixel circuit further includes:
a second switching transistor having a gate electrode, the second switching transistor connected between the gate electrode of the driving transistor and the second electrode of the driving transistor, the second switching transistor configured to receive a second scan signal through the gate electrode of the second switching transistor;
a third switching transistor having a gate electrode, the third switching transistor connected between a reference voltage line and the first node, the third switching transistor configured to receive the emission signal through the gate electrode of the third switching transistor; and
a fourth switching transistor having a gate electrode, the fourth switching transistor connected between an initialization voltage line and the anode of the light emitting element, the fourth switching transistor configured to receive the second scan signal through the gate electrode of the fourth switching transistor.

19. The display device of claim 18, wherein the second switching transistor comprises a plurality of sub-transistors connected in series, the plurality of sub-transistors include a plurality of gate electrodes, and the plurality of sub-transistors receive the second scan signal through the plurality of gate electrodes.

20. A pixel circuit comprises:
a light emitting element having an anode;
a driving transistor having a first electrode connected to a high potential driving voltage line, a second electrode electrically connected to the light emitting element, and a gate electrode connected to a date line;
a light emitting transistor having a first electrode connected to the driving transistor, a second electrode connected to the light emitting element, and a gate electrode connected to an emission signal line;
an initialization transistor having a first electrode connected to an initialization voltage line, a second electrode connected to the anode of the light emitting element, and a gate electrode connected to an inverted emission signal line; and
a coupling capacitor electrically connected between an inverted emission signal line and the gate electrode of the driving transistor,
wherein an emission signal is supplied through the emission signal line, and an inverted emission signal is supplied through the inverted emission signal line, the inverted emission signal having a phase opposite to a phase of the emission signal.

21. A method of driving the pixel circuit of claim 20, wherein the pixel circuit is driven in a variable refresh rate mode, each frame of a plurality of frames comprising at least one refresh period and at least one skip period,
wherein each skip period of the at least one skip period comprises an initialization period and an emission period, and
wherein, during the initialization period, an inverted emission signal having a turn-on level is applied to the gate electrode of the initialization transistor and an initialization voltage is applied to the anode of the light emitting element.

* * * * *